(12) United States Patent
Herr et al.

(10) Patent No.: US 12,206,413 B2
(45) Date of Patent: Jan. 21, 2025

(54) SFQ-BASED PULSE-CONSERVING LOGIC GATES

(71) Applicant: IMEC VZW, Leuven (BE)

(72) Inventors: Quentin Paul Herr, Leuven (BE); Anna Yurievna Herr, Leuven (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 17/815,368

(22) Filed: Jul. 27, 2022

(65) Prior Publication Data
US 2024/0039541 A1    Feb. 1, 2024

(51) Int. Cl.
*H03K 19/195* (2006.01)
*H03K 19/17736* (2020.01)
*H03K 19/23* (2006.01)
*H10N 60/01* (2023.01)

(52) U.S. Cl.
CPC ......... *H03K 19/23* (2013.01); *H03K 19/1774* (2013.01); *H10N 60/0912* (2023.02)

(58) Field of Classification Search
CPC . H03K 19/1774; H03K 19/23; H10N 60/0912
See application file for complete search history.

(56) References Cited

U.S. PATENT DOCUMENTS

| | | | | |
|---|---|---|---|---|
| 4,947,118 A | * | 8/1990 | Fujimaki | G01R 33/0356 327/527 |
| 5,164,618 A | * | 11/1992 | Murphy | H03K 19/1952 505/859 |
| 5,598,105 A | * | 1/1997 | Kurosawa | H03K 19/1954 326/1 |
| 6,734,699 B1 | * | 5/2004 | Herr | H03K 19/1952 326/1 |
| 7,852,106 B2 | * | 12/2010 | Herr | G06N 10/00 326/4 |
| 9,543,959 B1 | | 1/2017 | Carmean et al. | |
| 9,712,172 B2 | * | 7/2017 | Shauck | H03K 19/17724 |
| 9,887,700 B2 | | 2/2018 | Carmean et al. | |

(Continued)

OTHER PUBLICATIONS

PCT International Search Report and Written Opinion, Application No. PCT/IB2023/000434, mailed Dec. 19, 2023, 15 pages.

(Continued)

*Primary Examiner* — Kurtis R Bahr
(74) *Attorney, Agent, or Firm* — McDonnell Boehnen Hulbert & Berghoff LLP

(57) ABSTRACT

Josephson junction based logic devices and methods for their use are described. An example Josephson junction based logic device includes a two-input OR/AND (OA2) gate. The OA2 gate includes a first input node inductively coupled to a first input source and a second input node inductively coupled to a second input source. The first and second input sources are configured to provide single-flux-quantum (SFQ) pulses. The OA2 gate also includes first plurality of inductors coupled between the first input node and one of: a first output node or a second output node. The OA2 gate additionally includes a second plurality of inductors coupled between the second input node and one of: the first or the second output nodes. The OA2 gate also includes Josephson junctions coupled between a common node and one of: the first or the second input node, or the first or the second output node.

14 Claims, 28 Drawing Sheets

(56) References Cited

U.S. PATENT DOCUMENTS

| | | | |
|---|---|---|---|
| 10,090,841 B1 | 10/2018 | Herr | |
| 10,103,735 B1 | 10/2018 | Herr | |
| 10,103,736 B1 * | 10/2018 | Powell, III | B82Y 10/00 |
| 10,158,363 B1 * | 12/2018 | Braun | H03K 19/195 |
| 10,355,696 B1 | 7/2019 | Herr | |
| 2010/0033206 A1 | 2/2010 | Herr et al. | |
| 2019/0237648 A1 * | 8/2019 | Przybysz | G06N 10/00 |

OTHER PUBLICATIONS

Kari, Jarkko, and Irek Ulidowski. Reversible Computation. Springer International Publishing:, 2018.

Herr, Quentin P., Anna Y. Herr, Oliver T. Oberg, and Alexander G. Ioannidis. "Ultra-low-power superconductor logic." Journal of applied physics 109, No. 10 (2011): 103903.

Hosoya, Mutsumi, Willy Hioe, Juan Casas, Ryotaro Kamikawai, Yutaka Harada, Yasou Wada, Hideaki Nakane, Reiji Suda, and Eiichi Goto. "Quantum flux parametron: a single quantum flux device for Josephson supercomputer." IEEE Transactions on Applied Superconductivity 1, No. 2 (1991): 77-89.

Rylov, Sergey V. "Clockless dynamic SFQ and gate with high input skew tolerance." IEEE Transactions on Applied Superconductivity 29, No. 5 (2019): 1-5.

* cited by examiner

330

| Input Code | True Inputs 2 1 0 | Boolean Function | Input Code | True Inputs 2 1 0 | Boolean Function |
|---|---|---|---|---|---|
| 0 | 0 0 0 | Tie Low | 7 | 1 1 1 | Tie High |
| 1 | 0 0 1 | NOR2 | 6 | 1 1 0 | OR2 |
| 2 | 0 1 0 | XOR2 | 5 | 1 0 1 | XNOR2 |
| 3 | 0 1 1 | NAND2 | 4 | 1 0 0 | AND2 |

Figure 3C

| Input Code | True Inputs 3 2 1 0 | Boolean Function | Input Code | True Inputs 3 2 1 0 | Boolean Function |
|---|---|---|---|---|---|
| 0 | 0 0 0 0 | Tie Low | 15 | 1 1 1 1 | Tie High |
| 1 | 0 0 0 1 | NOR3 | 14 | 1 1 1 0 | OR3 |
| 2 | 0 0 1 0 | XS3 | 13 | 1 1 0 1 | XNS3 |
| 3 | 0 0 1 1 | NMAJ3 | 12 | 1 1 0 0 | MAJ3 |
| 4 | 0 1 0 0 | XD3 | 11 | 1 0 1 1 | XND3 |
| 5 | 0 1 0 1 | XNOR3 | 10 | 1 0 1 0 | XOR3 |
| 6 | 0 1 1 0 | XNE3 | 9 | 1 0 0 1 | XE3 |
| 7 | 0 1 1 1 | NAND3 | 8 | 1 0 0 0 | AND3 |

Figure 7E

SFQ-BASED PULSE-CONSERVING LOGIC GATES

FIELD OF THE DISCLOSURE

This application relates to superconducting circuits. In particular, this application discloses various Josephson junction based logic devices and methods of their use.

BACKGROUND

Superconducting digital systems are capable of performing computing operations at clock speeds in excess of 100 GHz. In these systems, the circuits comprise superconducting wires and Josephson junctions that together form superconducting loops in which information in the form of a single flux magnetic quantum (SFQ) is encoded and stored.

The superconducting circuits can be configured to implement traditional logic gates such as AND gates, OR gates, Flip Flops, etc. These gates, in turn, can be configured to implement more complex logic such as shift registers, counters, processors, etc.

SFQ pulse-based logic devices work by passing, storing, creating, and annihilating pulses. Scalability and combinational behavior of the varied logic families has improved with time (i.e., RSFQ, QFP, RQL), but the efficiency of the logic gate implementations remains a challenge. Inversion is particularly expensive, in contrast to CMOS.

SUMMARY

The present disclosure solves the inversion problem for SFQ logic, and more generally 1) recreates all the functions of a standard CMOS gate library, using pulse-conserving gates and dual-rail data encoding. For completeness, the present disclosure describes gate implementations of 2) a D-latch device configured to remove signal dither and 3) single-ended to dual-rail data conversion device that is configured for implementation without need for transformers.

In a first aspect, a Josephson junction based logic device is provided. The Josephson junction based logic device includes a two-input OR/AND (OA2) gate. The OA2 gate includes a first input node inductively coupled to a first input source and a second input node inductively coupled to a second input source. The first input source and the second input source are configured to provide single-flux-quantum (SFQ) pulses. The OA2 gate also includes a first plurality of inductors coupled between the first input node and one of: a first output node or a second output node. The OA2 gate additionally includes a second plurality of inductors coupled between the second input node and one of: the first output node or the second output node. The OA2 gate also includes a plurality of Josephson junctions. Each Josephson junction is coupled between a common node and one of: the first input node, the second input node, the first output node, or the second output node.

In a second aspect, a Josephson junction based logic device is provided. The Josephson junction based logic device includes a three-input OR/MAJ/AND (OMA3) gate. The OMA3 gate includes a first input node inductively coupled to a first input source, a second input node inductively coupled to a second input source, and a third input node inductively coupled to a third input source. The first input source, the second input source, and the third input source are configured to provide single-flux-quantum (SFQ) pulses. The OMA3 gate also includes a first plurality of inductors coupled between the first input node and one of: a first output node, a second output node, or a third output node, a second plurality of inductors coupled between the second input node and one of: the first output node, the second output node, or the third output node, and a third plurality of inductors coupled between the third input node and one of: the first output node, the second output node, or the third output node. The OMA3 gate further includes a plurality of Josephson junctions. Each Josephson junction is coupled between a common node and one of: the first input node, the second input node, the third input node, the first output node, the second output node, or the third output node.

In a third aspect, a method is provided. The method includes providing a single-flux-quantum (SFQ) based input to a first input source and a second input source of a Josephson junction based logic device. The Josephson junction based logic device includes a first input node inductively coupled to the first input source and a second input node inductively coupled to the second input source. The Josephson junction based logic device also includes a first plurality of inductors coupled between the first input node and one of: a first output node or a second output node. The Josephson junction based logic device additionally includes a second plurality of inductors coupled between the second input node and one of: the first output node or the second output node. The Josephson junction based logic device further includes a plurality of Josephson junctions. Each Josephson junction is coupled between a common node and one of: the first input node, the second input node, the first output node, or the second output node. The method also includes, in response to the input, providing at the first output node an OR2 output. The OR2 output is a result of a logical OR function based on the input, and providing at the second output node an AND2 output. The AND2 output is configured to provide a result of a logical AND function based on the input.

BRIEF DESCRIPTION OF THE FIGURES

The above, as well as additional features, will be better understood through the following illustrative and non-limiting detailed description of example embodiments, with reference to the appended drawings.

FIG. 3C illustrates a table of Boolean logic functions possible with the arrangement of gates of FIG. 3A, in accordance with example embodiments.

FIG. 7E illustrates a table of possible logic functions and outputs corresponding to an arrangement of OMA3 gates, in accordance with example embodiments.

Figure 1:
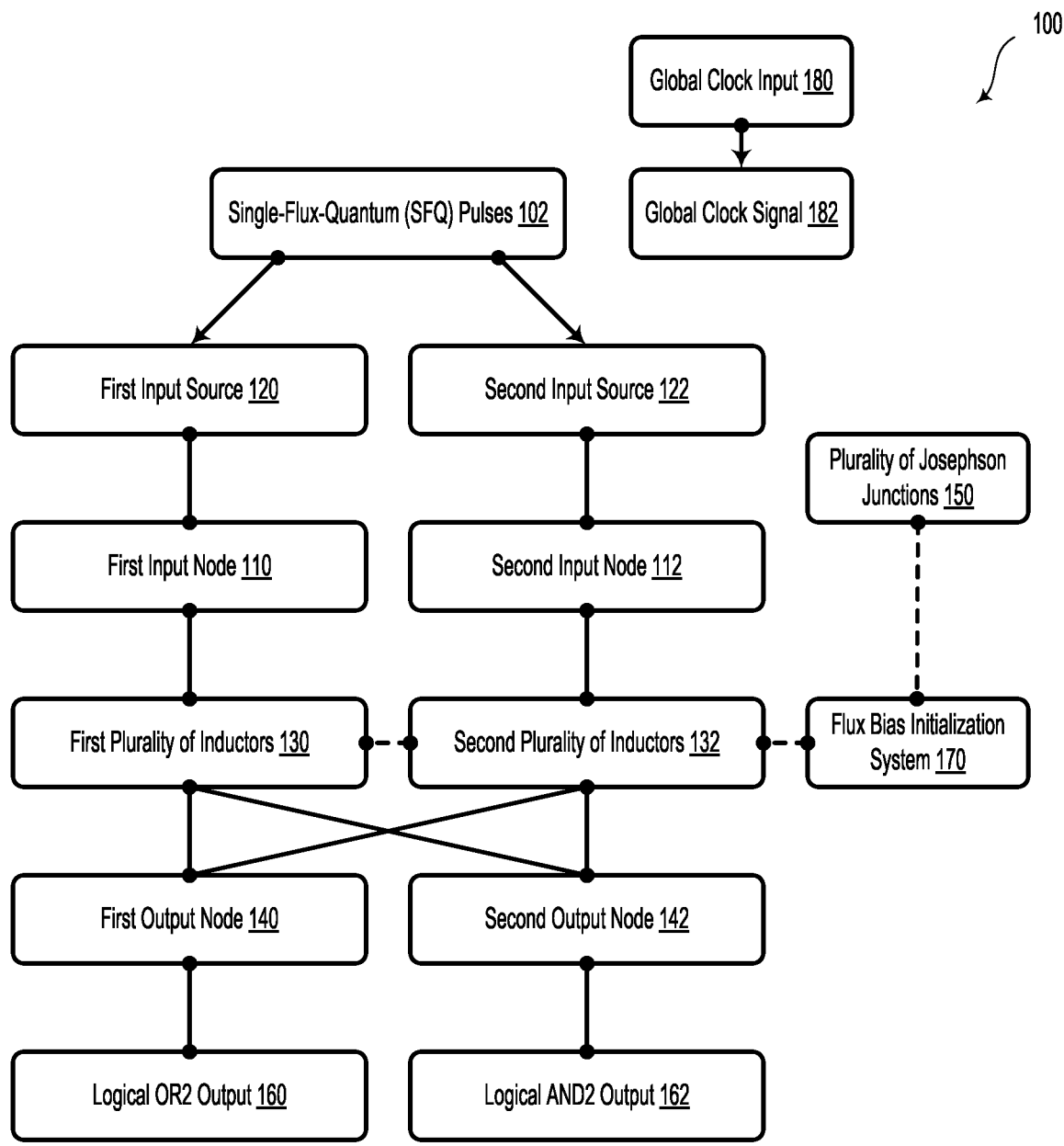
FIG. 1 illustrates a block diagram of a Josephson junction based two-input OR/AND (OA2) gate, in accordance with example embodiments.

All the figures are schematic, not necessarily to scale, and generally only show parts that are necessary to elucidate example embodiments, wherein other parts may be omitted or merely suggested.

DETAILED DESCRIPTION

Various examples of systems, devices, and/or methods are described herein with reference to the accompanying drawings. Any embodiment, implementation, and/or feature described herein as being an example is not necessarily to be construed as preferred or advantageous over any other embodiment, implementation, and/or feature unless stated as such. Thus, other embodiments, implementations, and/or features may be utilized, and other changes may be made without departing from the scope of the subject matter presented herein.

Accordingly, the examples described herein are not meant to be limiting. It will be readily understood that the aspects of the present disclosure, as generally described herein, and illustrated in the figures, can be arranged, substituted, combined, separated, and designed in a wide variety of different configurations.

Further, unless the context suggests otherwise, the features illustrated in each of the figures may be used in combination with one another. Thus, the figures should be generally viewed as component aspects of one or more overall embodiments, with the understanding that not all illustrated features are necessary for each embodiment.

Additionally, any enumeration of elements, blocks, or steps in this specification or the claims is for purposes of clarity. Thus, such enumeration should not be interpreted to require or imply that these elements, blocks, or steps adhere to a particular arrangement or are carried out in a particular order.

Moreover, terms such as "substantially" or "about" that may be used herein are meant that the recited characteristic, parameter, or value need not be achieved exactly, but that deviations or variations, including, for example, tolerances, measurement error, measurement accuracy limitations and other factors known to those skilled in the art, may occur in amounts that do not preclude the effect the characteristic was intended to provide.

Further, terms such as "A coupled to B," "A electrically coupled to B," etc., do not necessarily mean that items A and B are directly coupled to one another. For example, a first component electrically coupled to a second component is interpreted to mean that the components are either directly coupled (e.g., via a conductor) or coupled to one another via one or more resistors, capacitors, inductors, and/or other active or passive components.

As noted above, superconducting circuits comprise superconducting wires and Josephson junctions that together form superconducting loops in which information in the form of a single flux magnetic quantum (SFQ) is encoded and stored. Examples of AC powered Single Flux Quantum (AC-SFQ) superconducting circuits correspond to reciprocal quantum logic (RQL) circuits, and quantum flux parametron (QFP) circuits, where both power and clock are provided by multi-phase alternating current signals.

The superconducting wires are formed from materials that can carry a direct electrical current (DC) in the absence of an electric field. Such materials have almost zero resistance at or below their critical temperature. One example superconductor, niobium, has a critical temperature (Tc) of 9.3 Kelvin. At temperatures below the critical temperature, niobium is superconductive. However, at temperatures above the critical temperature, niobium behaves like a normal metal with electrical resistance.

The Josephson junctions include two superconductors coupled via a region that impedes current. Examples of this region include or correspond to a physical narrowing of the superconductor itself, a metal region, or a thin insulating barrier. Some examples of Josephson junctions comprise niobium superconductors and an $Al_2O_3$ barrier therebetween. When the potential difference between the two superconductors is integrated with respect to time over one cycle of phase change, the magnetic flux through the loop changes by an integer multiple of a single quantum of magnetic flux. The voltage pulse associated with the single quantum of magnetic flux corresponds to the SFQ pulse referred to above. As an example, overdamped Josephson junctions can create individual SFQ pulses. In AC-SFQ circuits, each Josephson junction may be part of one or more superconducting loops. The phase difference across the junction may be modulated by the magnetic flux applied to the loop.

The present disclosure relates to SFQ-based pulse-conserving logic gates that have an equal number of outputs as inputs and convert the input to thermometer code. A two-output implementation is described as an improvement on conventional designs and generalizes to all-new gates with multiple outputs. These gates lend themselves to efficient implementations of all standard logic functions when using dual rail data encoding. Implementations of the exclusive-OR and the full adder are particularly efficient. The present disclosure solves the "inversion problem" of pulse-based SFQ logic. The gates avoid physically large components such as transformers, and can thus make use of 400M JJ/cm 2 with 12 levels of logic per pipeline stage at a clock rate of 30 GHz. These performance metrics achieve a computational density on par with leading-node CMOS.

Example Josephson Junction Based Logic Devices

The present disclosure describes an SFQ gate library built from a several logic primitives: a Josephson Transmission Line (JTL), an OA2 gate, and an OMA3 gate. In some examples, LC-shunted junctions could be utilized to produce a resonant clock-power network. The logic is AC-powered, which means that the gates pass positive and negative SFQ pulses in opposite halves of the clock cycle.

Advantages over conventional implementations include the elimination of transformers and the elimination of auxiliary inductors that connect the output junction to each other or to ground. This is accomplished by flux biasing the interconnect inductors directly.

FIG. 1 illustrates a block diagram of a Josephson junction based two-input OR/AND (OA2) gate 100, in accordance with example embodiments. The OA2 gate 100 includes a first input node 110 that is inductively coupled to a first input source 120. The OA2 gate 100 also includes a second input node 112 that is inductively coupled to a second input source 122. The first input source 120 and the second input source 122 are configured to provide single-flux-quantum (SFQ) pulses 102.

The OA2 gate 100 also includes a first plurality of inductors 130 coupled between the first input node 110 and one of: a first output node 140 or a second output node 142.

The OA2 gate 100 additionally includes a second plurality of inductors 132 coupled between the second input node 112 and one of: the first output node 140 or the second output node 142.

The OA2 gate 100 further includes a plurality of Josephson junctions 150. Each Josephson junction of the plurality of Josephson junctions 150 is coupled between a common node (e.g., ground) and one of: the first input node 110, the second input node 112, the first output node 140, or the second output node 142.

In an example embodiment, the first output node 140 could be configured to provide an OR2 output 160. In such scenarios, the OR2 output 160 is configured to provide a result of a logical OR function based on signals provided by the first input source 120 and the second input source 122.

In a further example, the second output node 142 could be configured to provide an AND2 output 162. In such a scenario, the AND2 output 162 is configured to provide a result of a logical AND function based on signals provided by the first input source 120 and the second input source 122.

In some embodiments, the OA2 gate 100 could be configured to produce one output pulse at the each output node (e.g., first output node 140 and second output node 142) in response to each input pulse provided at the input nodes (e.g., first input node 110 and second input node 112).

In various examples, the first plurality of inductors 130 could be biased with a flux bias equal to one-half SFQ. However, it will be understood that other flux bias values are possible and contemplated.

In some embodiments, OA2 gate 100 could additionally or alternatively include a global clock input 180 that is configured to provide a global clock signal 182. In such scenarios, the Josephson junction based OA2 gate 100 could be configured to operate based on the global clock signal 182. As an example embodiment, the global clock signal 182 has a clock frequency of at least 30 GHz.

In some examples, OA2 gate 100 could include a flux bias initialization system 170, which may be configured to initialize one or more inductors with a magnetic flux bias. The flux bias initialization system 170 could include one or more current sources configured to provide a current to one or more primary inductors, which may be inductively coupled to one or more secondary loops of the OMA3 gate.

In example embodiments, inputs and outputs of the OA2 gate 100 are generally connected to other gates via JTLs (not shown for clarity). All Josephson junctions are AC powered (not shown for clarity) either directly or through leakage from adjacent junctions. In various example embodiments, all inputs are inductively connected to all outputs.

In some examples, flux biases applied to the interconnect inductors may preferentially bias the outputs without disturbing the inputs and without the need for additional interconnects. After a positive SFQ on an input produces a positive event on the OR2 output, the preferential bias moves to the AND2 by addition of flux in the inductive loops. In such scenarios, a subsequent positive input will produce a positive output on AND2. Alternatively, a subsequent negative input would produce a negative output on OR2.

Figure 2A:
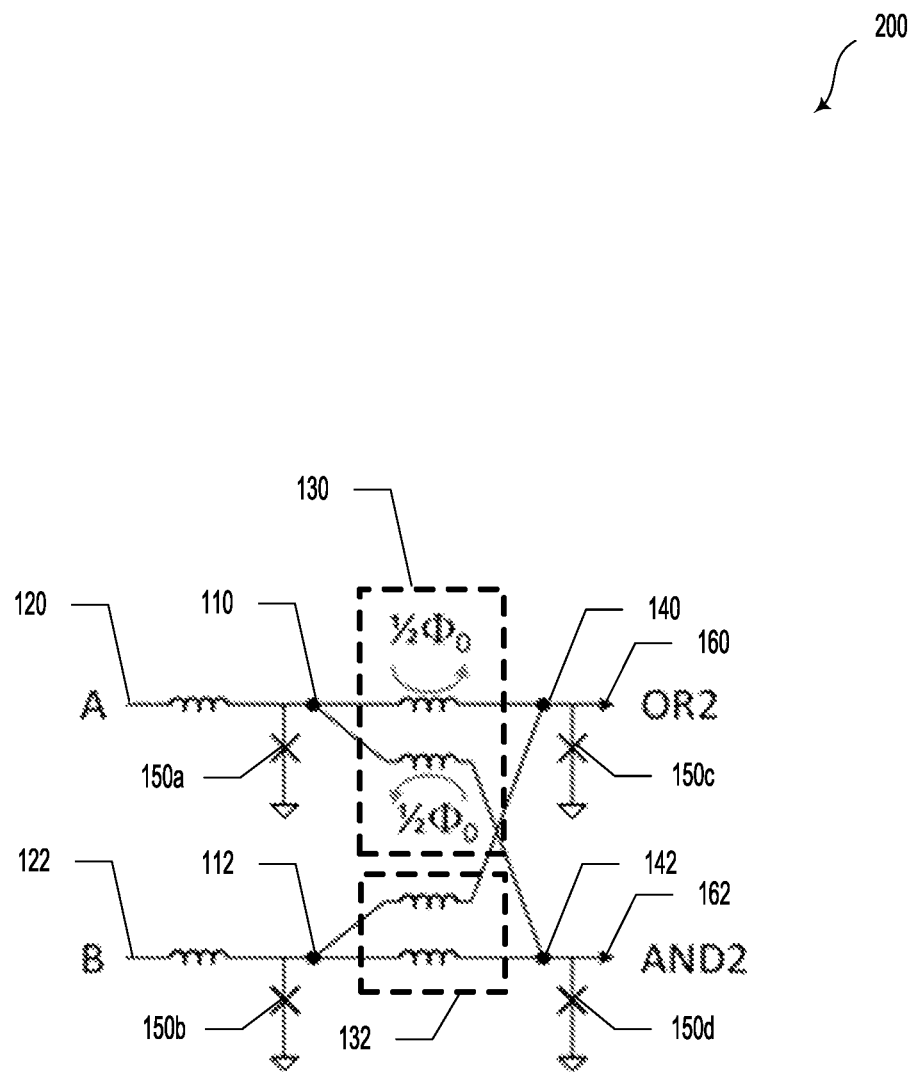
FIG. 2A illustrates a circuit schematic of a Josephson junction based two-input OR/AND (OA2) gate, in accordance with example embodiments.

FIG. 2A illustrates a circuit schematic of a Josephson junction based two-input OR/AND (OA2) gate 200, in accordance with example embodiments. In such a scenario, the flux bias applied to the first plurality of inductors 130 is equal to one-half SFQ.

Figure 2B:
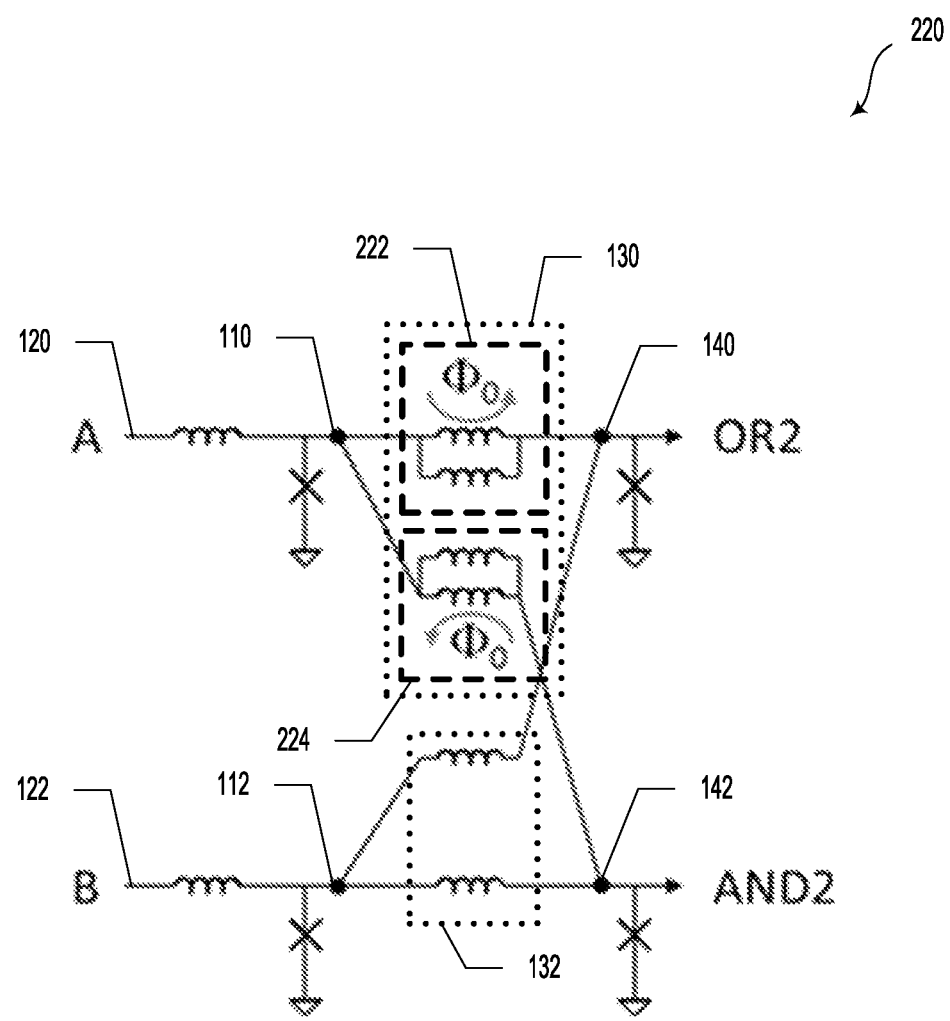
FIG. 2B illustrates a circuit schematic of a Josephson junction based two-input OR/AND (OA2) gate, in accordance with example embodiments.

FIG. 2B illustrates a circuit schematic of a Josephson junction based two-input OR/AND (OA2) gate 220, in accordance with example embodiments. In some examples, the first plurality of inductors 130 could include a first pair of inductors 222 coupled in parallel between the first input node 110 and the first output node 140 and a second pair of inductors 224 coupled in parallel between the first input node 110 and the second output node 142. In such a scenario, a full SFQ could be applied to one of two parallel inductors of the first pair of inductors 222 and the second pair of inductors 224.

Figure 3A:
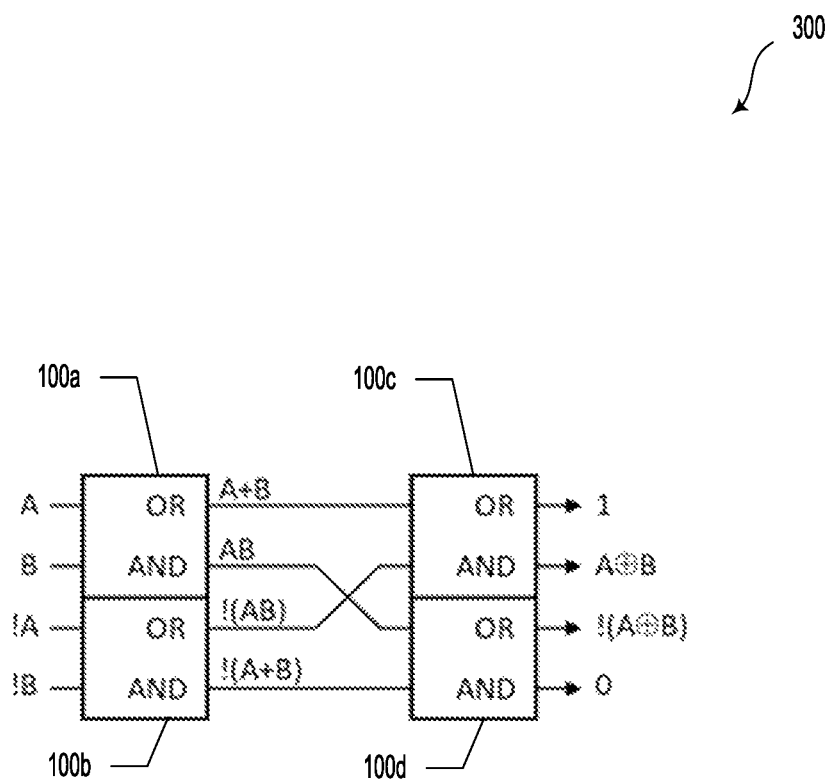
FIG. 3A illustrates a schematic logic block diagram of an arrangement of OA2 gates, in accordance with example embodiments.

FIG. 3A illustrates a schematic logic block diagram of an arrangement 300 of OA2 gates (e.g., OA2 gates 100*a*, 100*b*, 100*c*, and 100*d*), in accordance with example embodiments. As an example, a logic block could include a plurality of OA2 gates coupled together in a logic block configured to accept two dual rail inputs and provide a plurality of logical outputs comprising: OR2, NOR2, AND2, NAND2, XOR2, and XNOR2.

As an example embodiment, dual rail data encoding applied to the arrangement 300 of gates could produce OR2, NOR2, AND2, and NAND2 logical functions in a single stage, and XOR2 and XNOR2 in two stages.

Figure 3B:
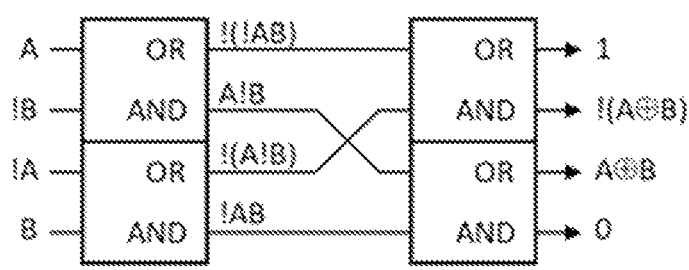
FIG. 3B illustrates a schematic logic block diagram of an arrangement of OA2 gates, in accordance with example embodiments.

FIG. 3B illustrates a schematic logic block diagram of an arrangement 320 of OA2 gates, in accordance with example embodiments. In an example, dual rail data encoding applied to the arrangement 320 of OA2 gates could produce XOR2 and XNOR2 in two stages with different intermediate values as compared to arrangement 300.

FIG. 3C illustrates a table 330 of Boolean logic functions possible with the arrangement 300 of OA2 gates of FIG. 3A, in accordance with example embodiments. The JTL, OA2, and OMA3 gates described herein all conserve pulses, meaning that each input pulse generates one output pulse. Furthermore, these gates have degenerate inputs, meaning the inputs are not distinguishable—only the total number of inputs that are high or low are important. The degenerate two-input logic functions are enumerated in FIG. 3C. The number of inputs that must be high (true) to produce a true output are given for each logic function. The "Input Code" numbers the logic functions accordingly.

Tie Low and Tie High are trivial functions corresponding to constant outputs that do not use input values. The remaining two-input logic functions are generated using dual rail data encoding and the OA2 gate 100.

Figure 4A:
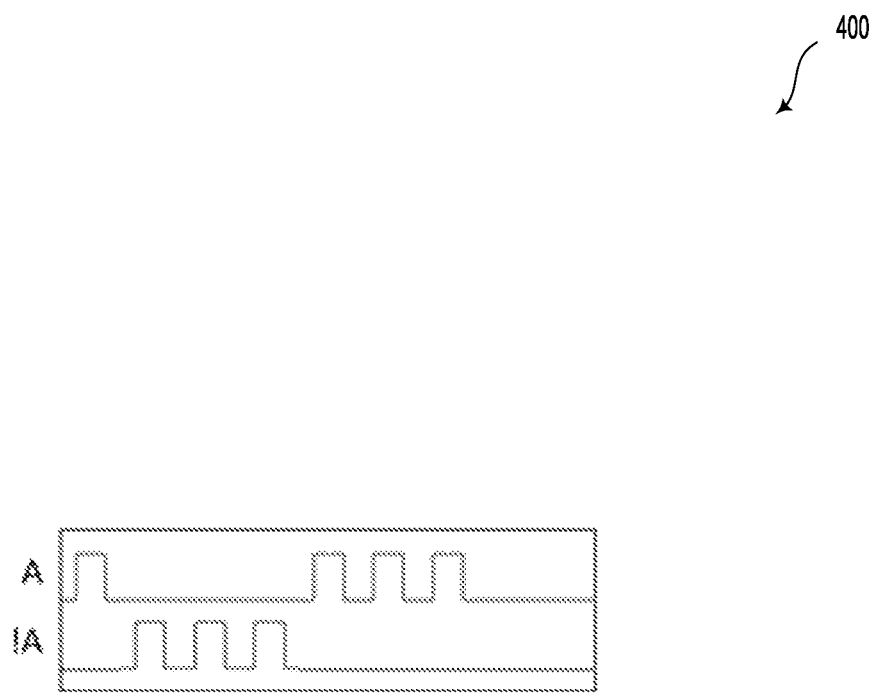
FIG. 4A illustrates dual rail waveforms, in accordance with example embodiments.

FIG. 4A illustrates dual rail waveforms 400, in accordance with example embodiments. The present dual-rail data encoding technique is energy efficient because while dual rail waveforms may dither from low to high every clock cycle, they may also persist in the low or high state for any number of clock cycles, minimizing transitions. In some implementations, both rails may indicate a low state in an inactive circuit.

Figure 4B:
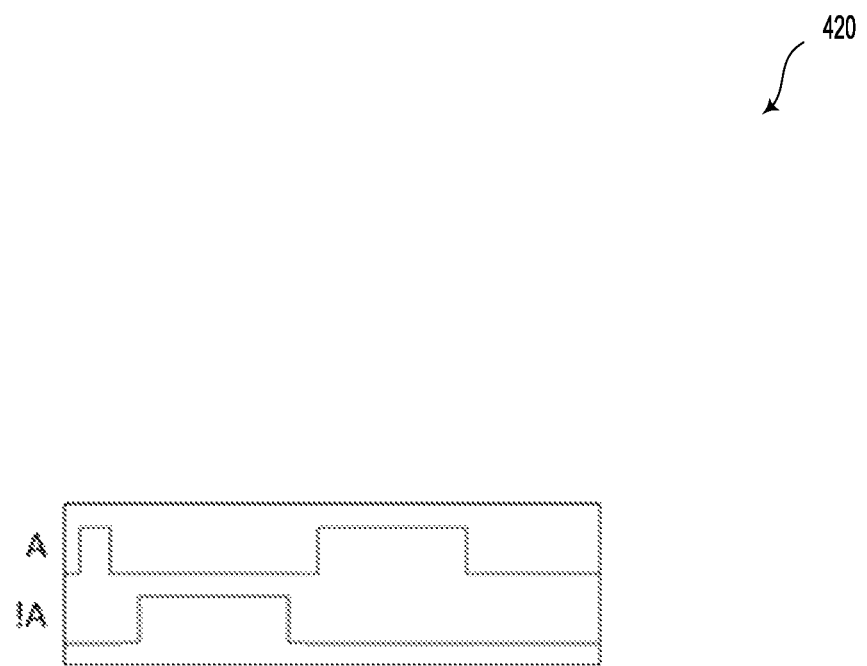
FIG. 4B illustrates dual rail waveforms, in accordance with example embodiments.

FIG. 4B illustrates dual rail waveforms 420, in accordance with example embodiments. The waveforms 400 and waveforms 420 have different numbers of transitions, but are logically equivalent, as the logically valid state is read during the positive half clock cycle.

Figure 5:
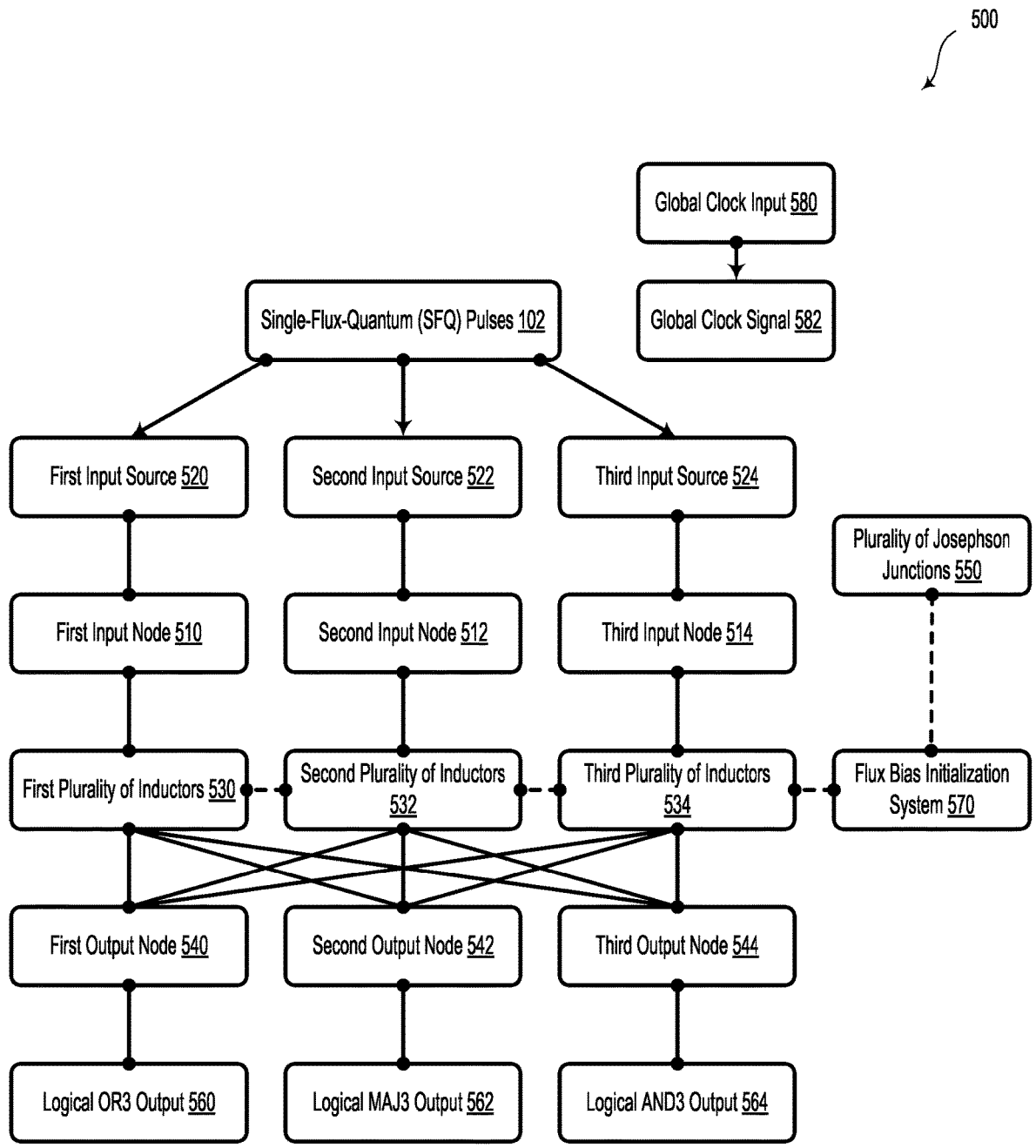
FIG. 5 illustrates a block diagram of a Josephson junction based three-input OR/MAJ/AND (OMA3) gate, in accordance with example embodiments.

FIG. 5 illustrates a block diagram of a Josephson junction based three-input OR/MAJ/AND (OMA3) gate 500, in accordance with example embodiments. In an example, the OMA3 gate 500 could be configured to produces logical OR3, MAJ3, and AND3 based on three inputs.

In an example embodiment, the OMA3 gate 500 includes a first input node 510 inductively coupled to a first input source 520, a second input node 512 inductively coupled to a second input source 522, and a third input node 514 inductively coupled to a third input source 524. In such scenarios, the first input source 520, the second input source 522, and the third input source 524 are configured to provide single-flux-quantum (SFQ) pulses.

The OMA3 gate 500 also includes a first plurality of inductors 530 coupled between the first input node 510 and one of: a first output node 540, a second output node 542, or a third output node 544. The OMA3 gate 500 additionally includes a second plurality of inductors 532 coupled between the second input node 512 and one of: the first output node 540, the second output node 542, or the third output node 544. The OMA3 gate 500 further includes a third plurality of inductors 534 coupled between the third input node 514 and one of: the first output node 540, the second output node 542, or the third output node 544.

The OMA3 gate 500 yet further includes a plurality of Josephson junctions 550. Each Josephson junction of the plurality of Josephson junctions 550 is coupled between a common node (e.g., ground) and one of: the first input node 510, the second input node 512, the third input node 514, the first output node 540, the second output node 542, or the third output node 544.

In an example embodiment, the first output node 540 could provide an OR3 output 560. In such a scenario, the OR3 output 560 is configured to provide a result of a logical OR function based on signals provided by the first input source 520, the second input source 522, and the third input source 524.

In some examples, the second output node 542 could provide a MAJ3 output 562. In such a scenario, the MAJ3 output 562 is configured to provide a result of a logical majority function based on signals provided by the first input source 520, the second input source 522, and the third input source 524.

In various other embodiments, the third output node 544 could provide an AND3 output 564. The AND3 output 564 is configured to provide a result of a logical AND function based on signals provided by the first input source 520, the second input source 522, and the third input source 524.

In some examples, the OMA3 gate 500 could be configured to produce one output pulse at the each output node in response to each input pulse provided at the input nodes.

In various embodiments, the OMA3 gate 500 could include a global clock input 580 configured to provide a global clock signal 582. In such scenarios, the Josephson junction based logic device could be configured to operate based on the global clock signal 582. Furthermore, in some examples, the global clock signal 582 could have a clock frequency of at least 30 GHz.

In some examples, OMA3 gate 500 could include a flux bias initialization system 570, which may be configured to initialize one or more inductors with a magnetic flux bias. The flux bias initialization system 570 could include one or more current sources configured to provide a current to one or more primary inductors, which may be inductively coupled to one or more secondary loops of the OMA3 gate.

Figure 6A:
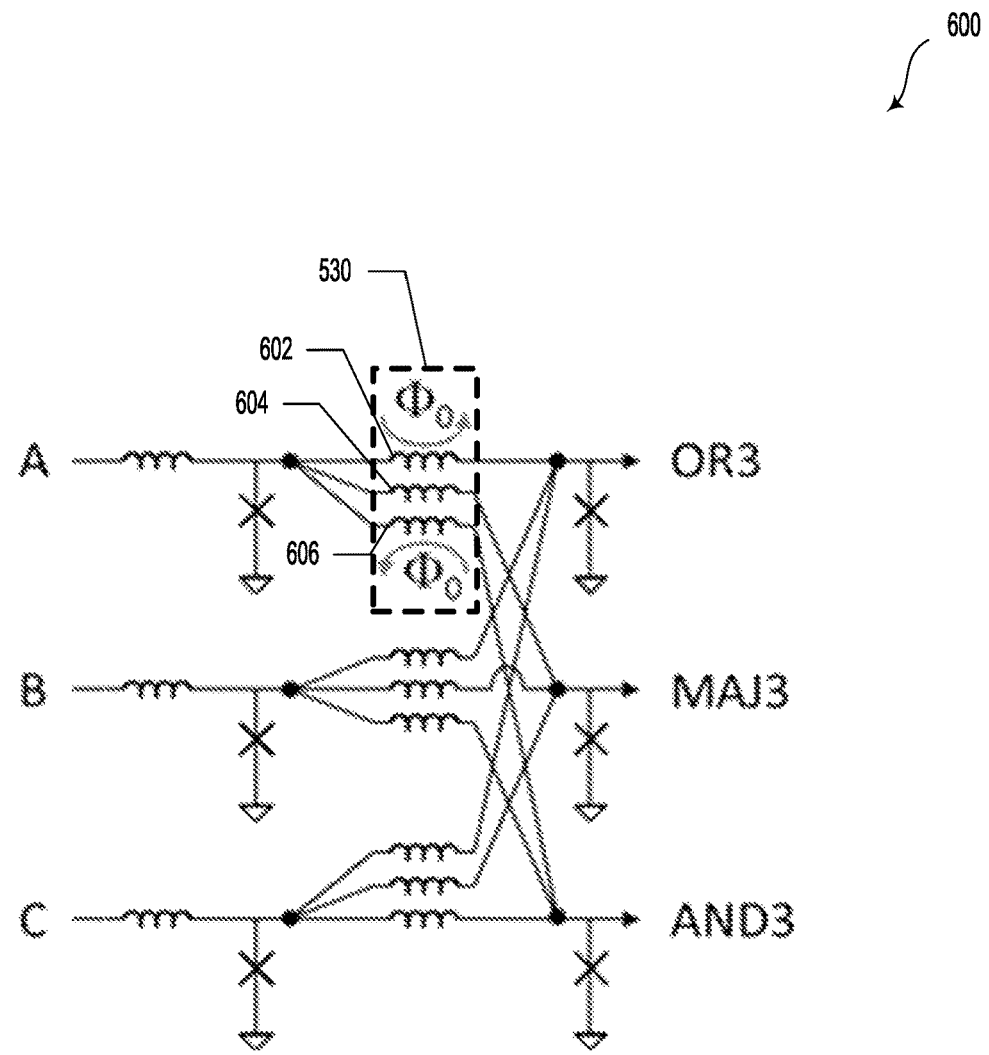
FIG. 6A illustrates a circuit diagram of a Josephson junction based three-input OR/MAJ/AND (OMA3) gate, in accordance with example embodiments.

FIG. 6A illustrates a circuit diagram of a Josephson junction based three-input OR/MAJ/AND (OMA3) gate 600, in accordance with example embodiments. In various examples, input and outputs are generally connected to other gates via JTLs (not shown for clarity). Furthermore, in some embodiments, Josephson junctions are AC powered (not shown for clarity) either directly or through leakage from adjacent junctions. In various examples, the inputs are inductively connected to all outputs. Yet further, flux biases may preferentially bias the outputs without disturbing the inputs and without need for additional interconnects. In some embodiments, after a positive SFQ on an input produces a positive event on the OR3 output, the preferential bias rotates forward to the MAJ3 output by addition of flux in the inductive loops. Furthermore, a subsequent positive input will produce a positive output on MAJ3 and rotation of the preferential bias to AND3. Yet further, negative inputs produce negative outputs and rotate the preferential bias in the opposite direction.

In various example embodiments, at least a portion of the first plurality of inductors 530 (e.g., inductor 602 and inductor 606) are biased with a flux bias equal to one full SFQ. In such scenarios, some of the first plurality of inductors 530 (e.g., inductor 604) could be configured to be unbiased. It will be understood that flux bias could be applied to other inductors of at least some of the first plurality of inductors 530, the second plurality of inductors 532, and/or the third plurality of inductors 534.

Figure 6B:
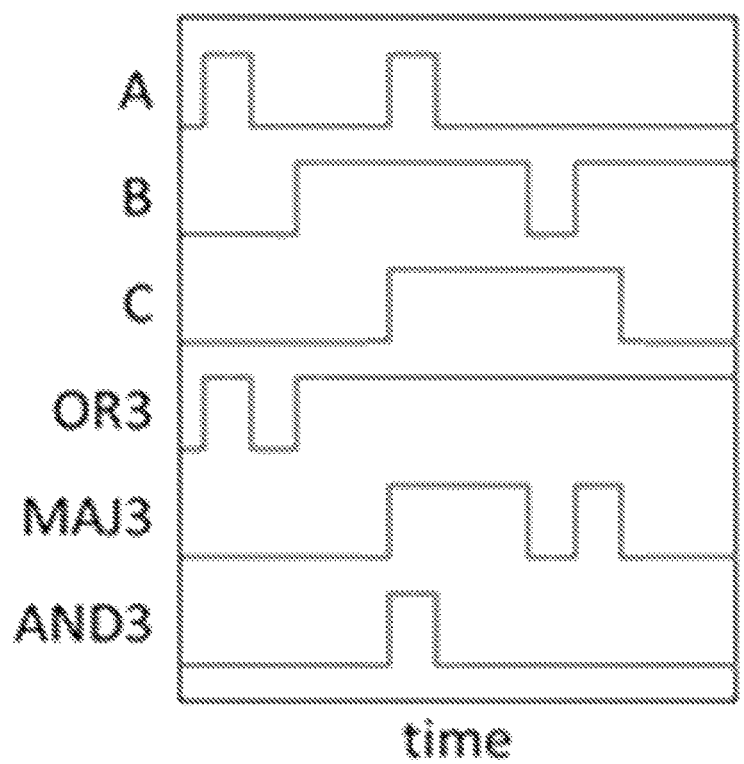
FIG. 6B illustrates a waveform diagram of the OMA3 gate of FIG. 6A, in accordance with example embodiments.

FIG. 6B illustrates a waveform diagram 620 of the OMA3 gate 600 of FIG. 6A, in accordance with example embodiments. In some embodiments, positive-polarity SFQ events cause positive transitions in Junction phase, and negative-polarity events cause negative transitions. Every input SFQ pulse produces a corresponding output pulse. Positive and negative transitions occur in opposite halves of the clock cycle but may be separated by any number of cycles.

Figure 7A:
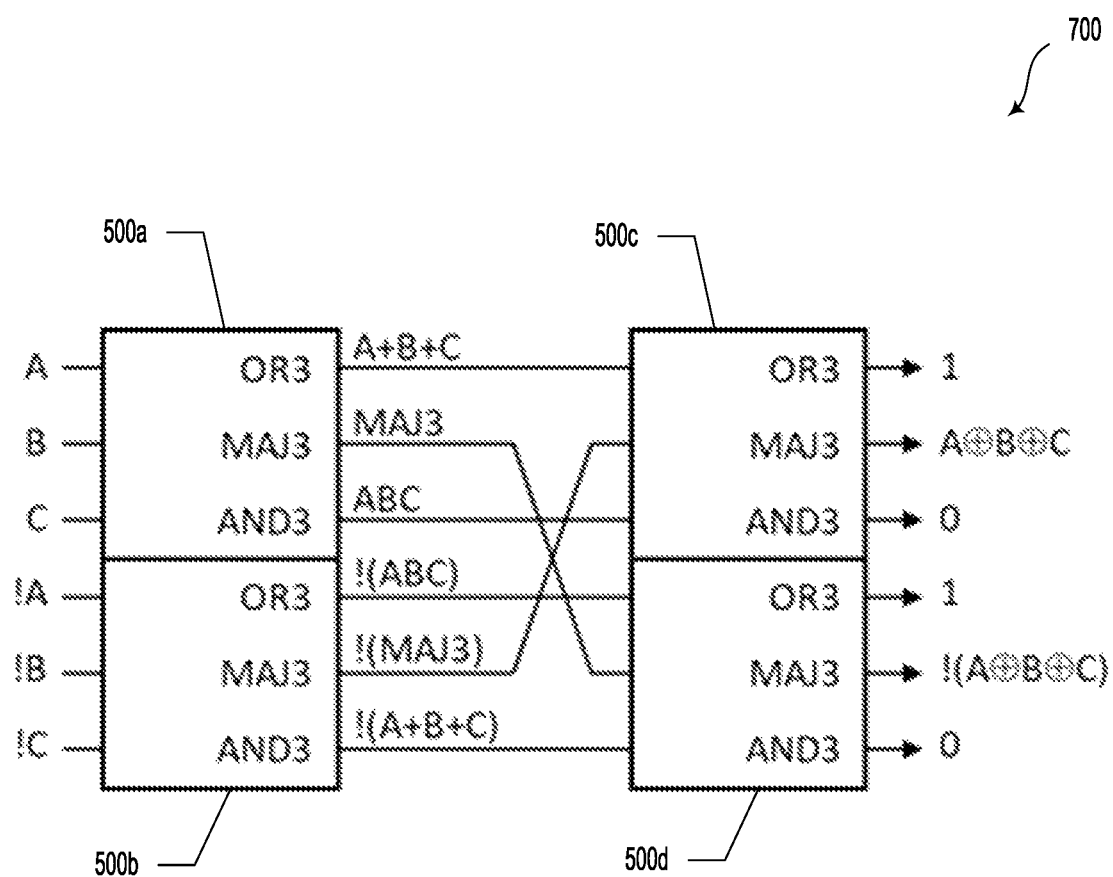
FIG. 7A illustrates a schematic logic block diagram of an arrangement of OMA3 gates, in accordance with example embodiments.

FIG. 7A illustrates a schematic logic block diagram of an arrangement 700 of OMA3 gates (e.g., OMA3 gates 500a, 500b, 500c, and 500d), in accordance with example embodiments. In some examples, arrangement 700 could include a plurality of OMA3 gates coupled together in a logic block configured to accept three dual rail inputs and provide a plurality of logical outputs include: NOR3, XS3, NMAJ3, XD3, XNOR3, XNE3, NAND3, OR3, XNS3, MAJ3, XND3, XOR3, XE3, and AND3. It will be understood that other logical functions are possible and contemplated within the scope of the present disclosure.

In an example embodiment, all standard three input logic functions could be produced in one or two stages using various combinations of the OA2 and OMA3 gates, specifically, arrangements 700, 720, 730, and 740 as illustrated and described in reference to FIGS. 7A, 7B, 7C, and 7D. As illustrated in FIG. 7A and arrangement 700, the MAJ3 function from the first stage and XOR3 from the second stage produce the logic of a full adder. Note that the OMA3 gate primitives in the second stage can never have three true inputs, allowing for a more efficient implementation.

Figure 7B:
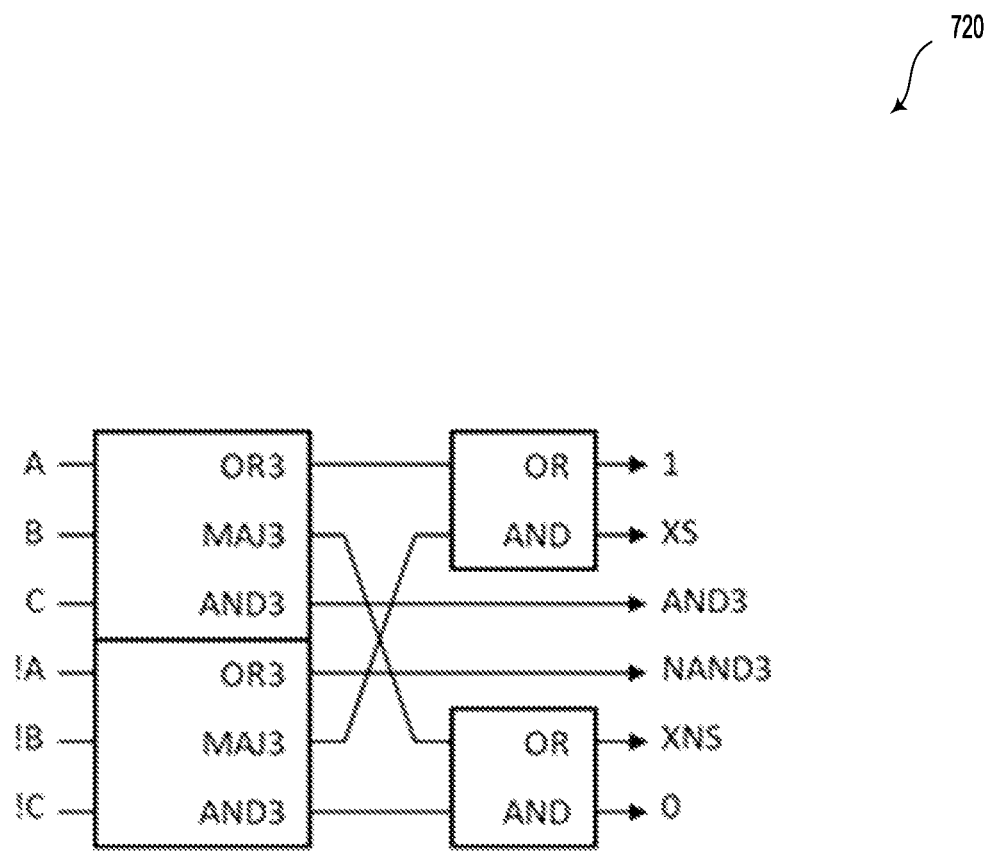
FIG. 7B illustrates a schematic logic block diagram of an arrangement of OMA3 gates and OA2 gates, in accordance with example embodiments.
Figure 7C:
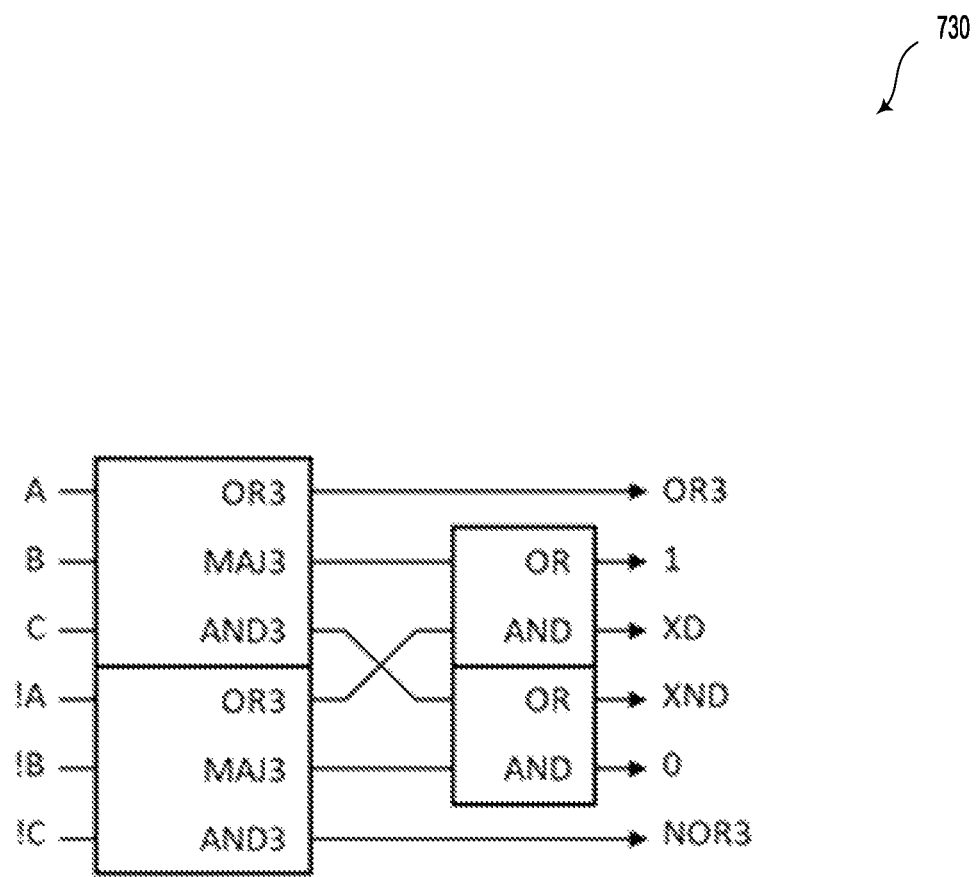
FIG. 7C illustrates a schematic logic block diagram of an arrangement of OMA3 gates and OA2 gates, in accordance with example embodiments.
Figure 7D:
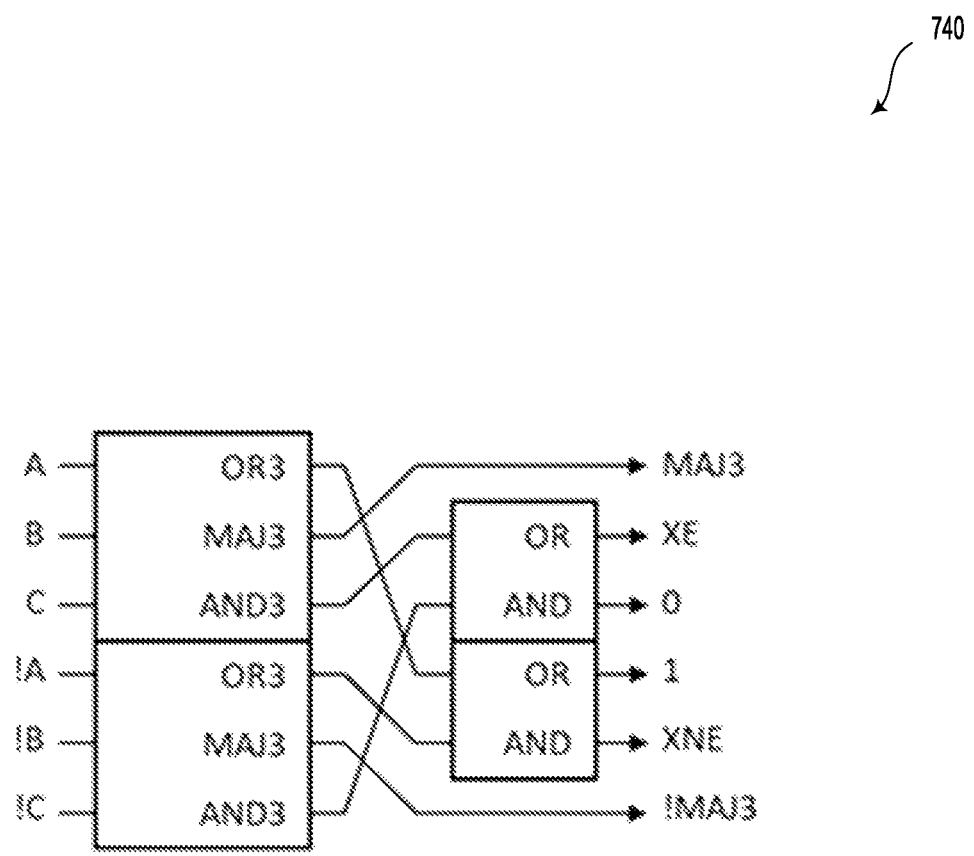
FIG. 7D illustrates a schematic logic block diagram of an arrangement of OMA3 gates and OA2 gates, in accordance with example embodiments.

Additionally or alternatively, various logic blocks could include various combinations of OMA3 and OA2 gates, as illustrated in FIGS. 7B, 7C, and 7D. In such scenarios, several non-standard logic functions, such as Exclusive Single input, XS, Exclusive Double inputs, XD, an Exclusive Equal inputs, XE are possible and contemplated.

FIG. 7B illustrates a schematic logic block diagram of an arrangement 720 of OMA3 gates (e.g., OMA3 gates 500) and OA2 gates (e.g., OA2 gates 100), in accordance with example embodiments.

FIG. 7C illustrates a schematic logic block diagram of an arrangement 730 of OMA3 gates (e.g., OMA3 gates 500) and OA2 gates (e.g., OA2 gates 100), in accordance with example embodiments.

FIG. 7D illustrates a schematic logic block diagram of an arrangement 740 of OMA3 gates (e.g., OMA3 gates 500) and OA2 gates (e.g., OA2 gates 100), in accordance with example embodiments.

FIG. 7E illustrates a table 750 of Boolean logic functions possible with an arrangement 700 of OMA3 gates, such as the arrangement illustrated and described in relation to FIG. 7A, in accordance with example embodiments. The degenerate three-input logic functions are enumerated in FIG. 7E. The number of inputs that must be high (true) to produce a true output are given for each logic function. The "Input Code" numbers the logic functions accordingly.

Tie Low and Tie High are trivial functions corresponding to constant outputs that do not use input values. The remaining three-input logic functions are generated using dual rail data encoding, the OA2 gate 100, and the OMA3 gate 500.

Figure 8:
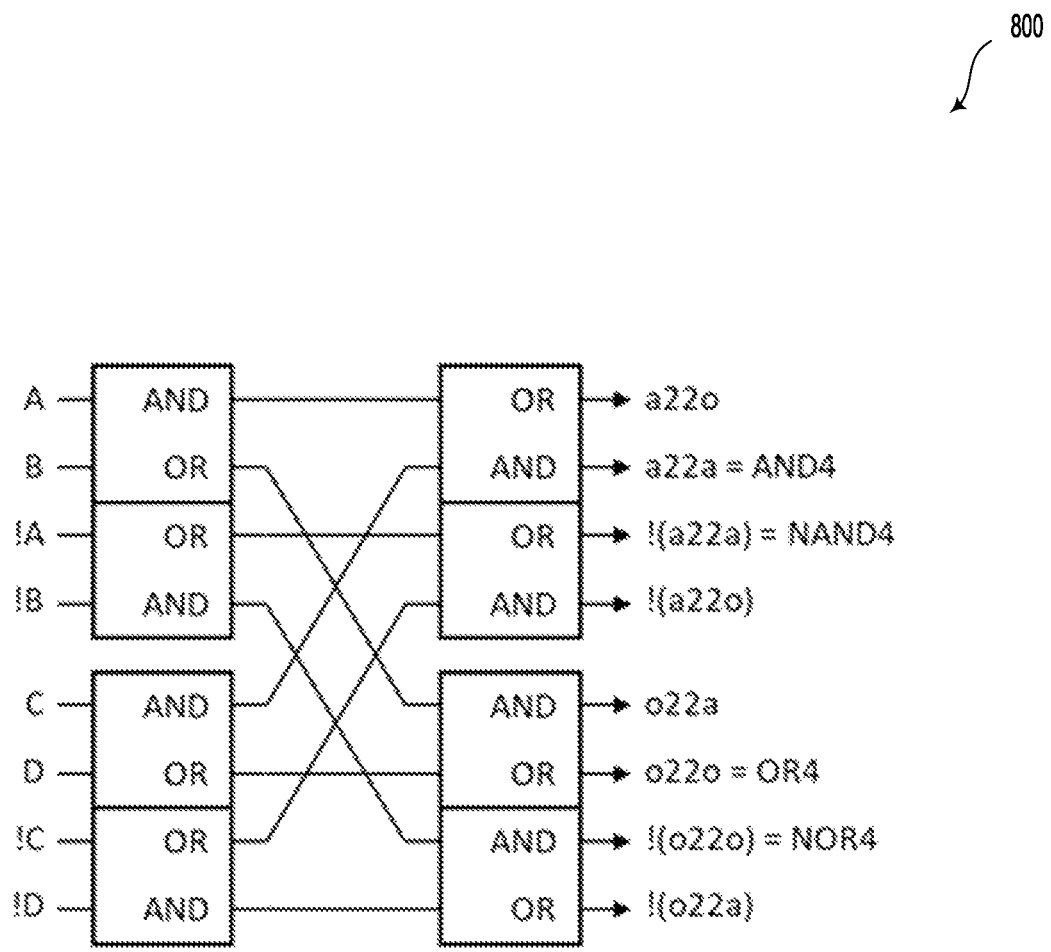
FIG. 8 illustrates a schematic logic block diagram of an arrangement of OA2 gates, in accordance with example embodiments.

It will be understood that four-input logic functions can be implemented in various logic blocks contemplated herein. For example, FIG. 8 illustrates a schematic logic block diagram of an arrangement 800 of eight OA2 gates, in accordance with example embodiments. In such an example, the eight OA2 gates could be arranged in two stages and may perform the logical functions of AND4, NAND4, OR4, NOR4, among others.

Figure 9:
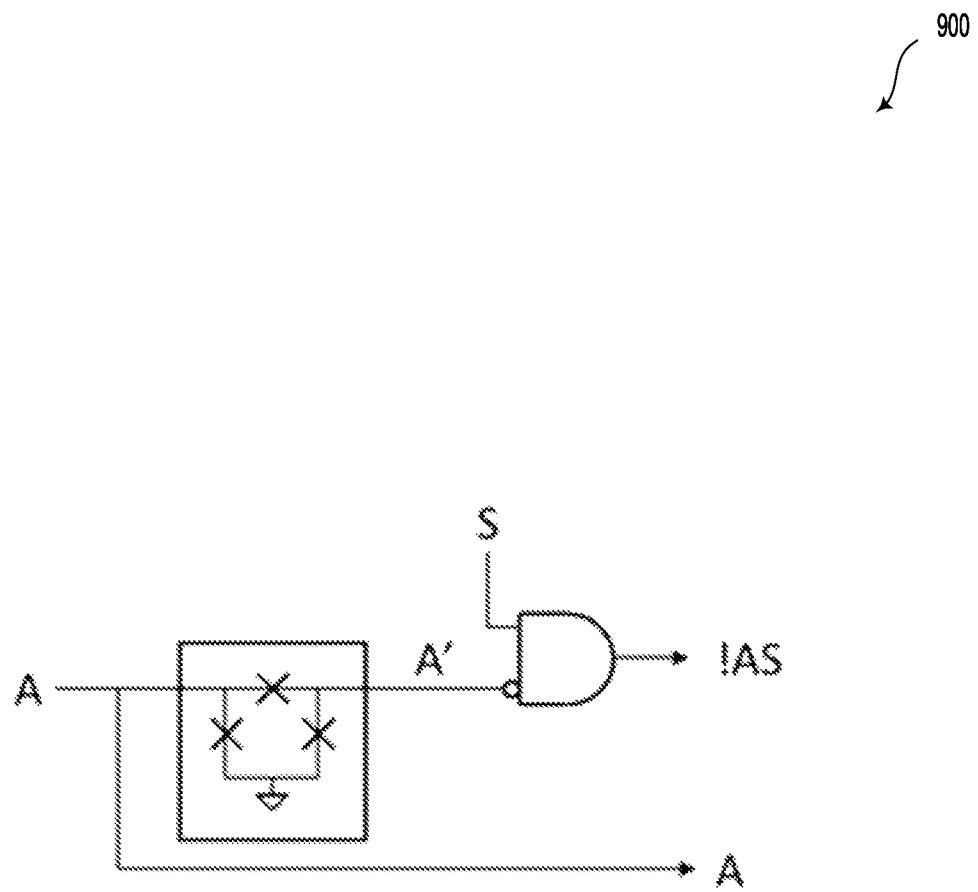
FIG. 9 illustrates a circuit diagram of a Josephson junction based circuit configured to provide a strobed logical inversion, in accordance with example embodiments.

Several other auxiliary operations are possible and contemplated herein. For example, a first auxiliary operation includes conversion from a single-ended encoded signal to a dual-rail encoded signal, which involves logical inversion. FIG. 9 illustrates a circuit diagram of a Josephson junction based circuit 900 that is configured to provide a strobed logical inversion, in accordance with example embodiments.

Logical inversion is implemented as polarity inversion to convert A to A', followed by logical inverter strobed with the signal S to produce the output !AS. Note that A and !AS are logically valid dual rail signals only when S is active. Otherwise, both rails are logical "zero," producing inactive logic cycles. It will be noted that in some embodiments, Josephson junction based circuit 900 could be configured to provide the strobed logical inversion without need for transformers (e.g., energy transfer involving a varying magnetic flux and primary and secondary loops/coils to change AC voltage levels).

Figure 10:
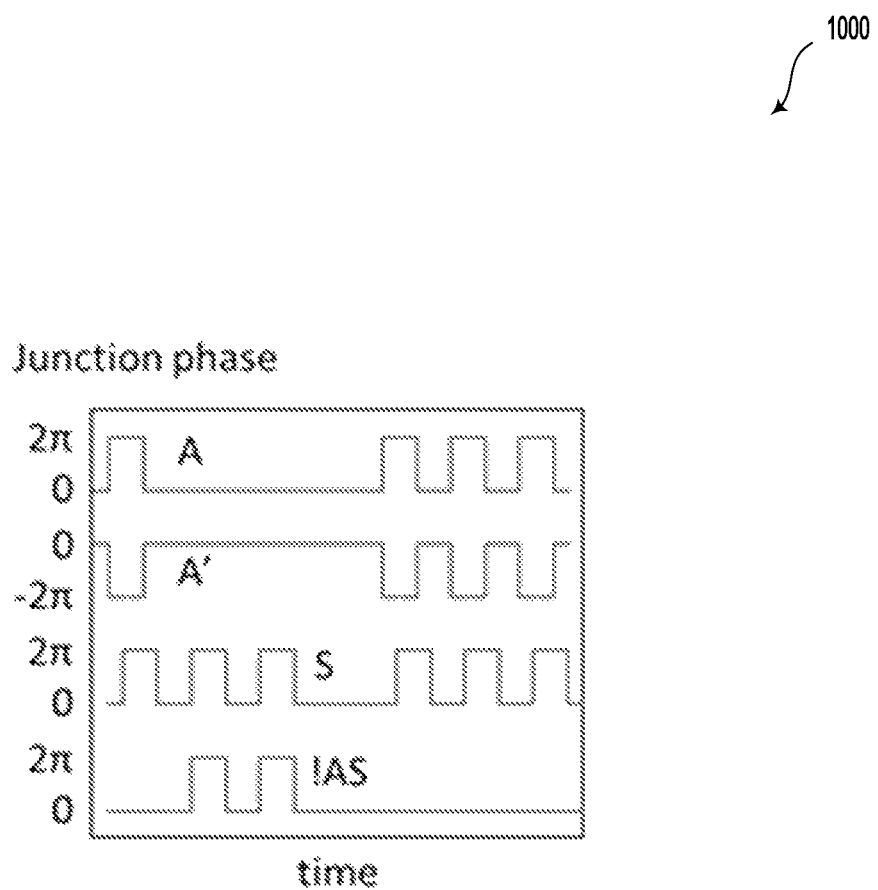
FIG. 10 illustrates a waveform diagram corresponding to an operation of the circuit of FIG. 9, in accordance with example embodiments.

FIG. 10 illustrates a waveform diagram 1000 corresponding to an operation of the circuit of FIG. 9, in accordance with example embodiments.

Figure 11:
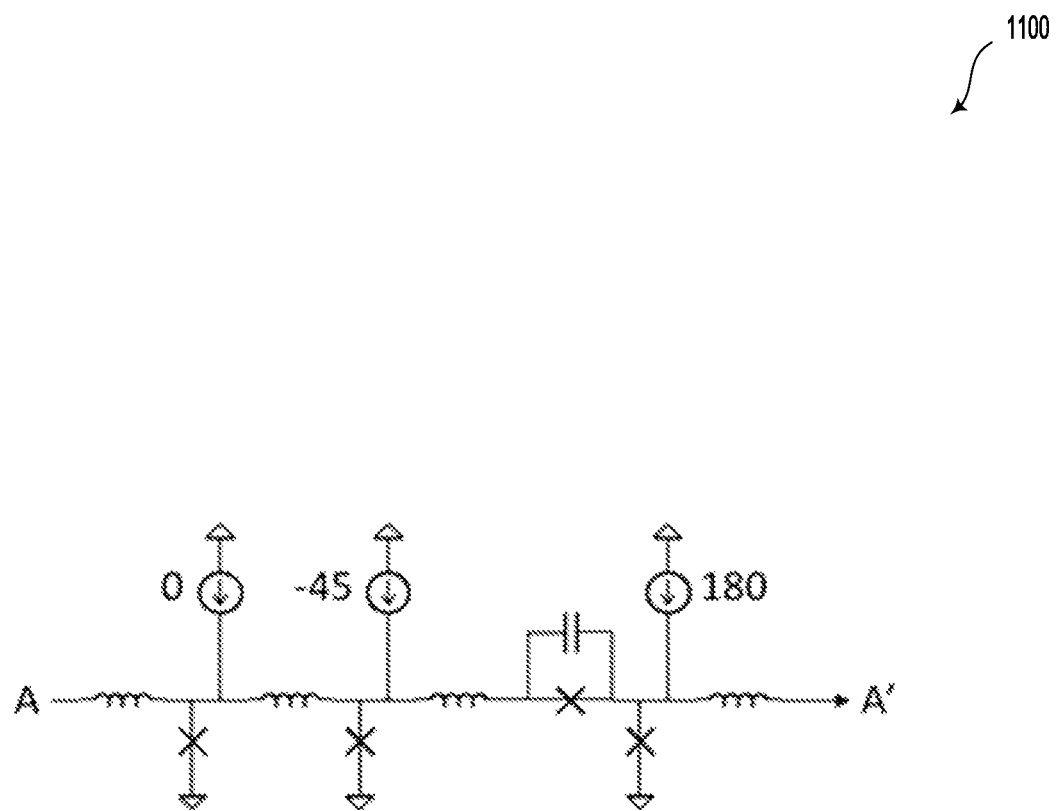
FIG. 11 illustrates a circuit diagram of a Josephson junction based circuit configured to provide a strobed logical inversion, in accordance with example embodiments.

FIG. 11 illustrates a circuit diagram of a Josephson junction based circuit 1100 configured to provide a polarity inversion, in accordance with example embodiments. It will be understood that other circuits configured to provide a polarity inversion are possible and contemplated within the scope of the present disclosure.

Figure 12A:
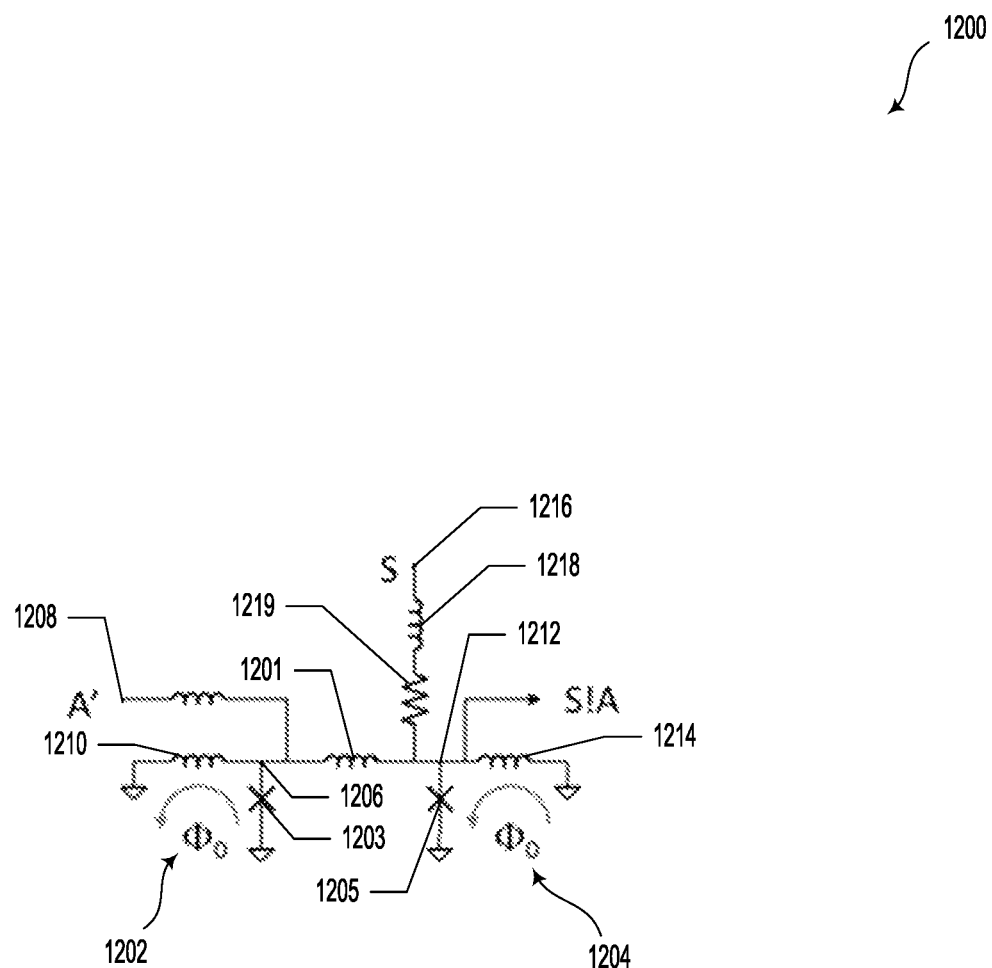
FIG. 12A illustrates a circuit diagram of a Josephson junction based circuit configured to provide a strobed logical inversion, in accordance with example embodiments.
Figure 12B:
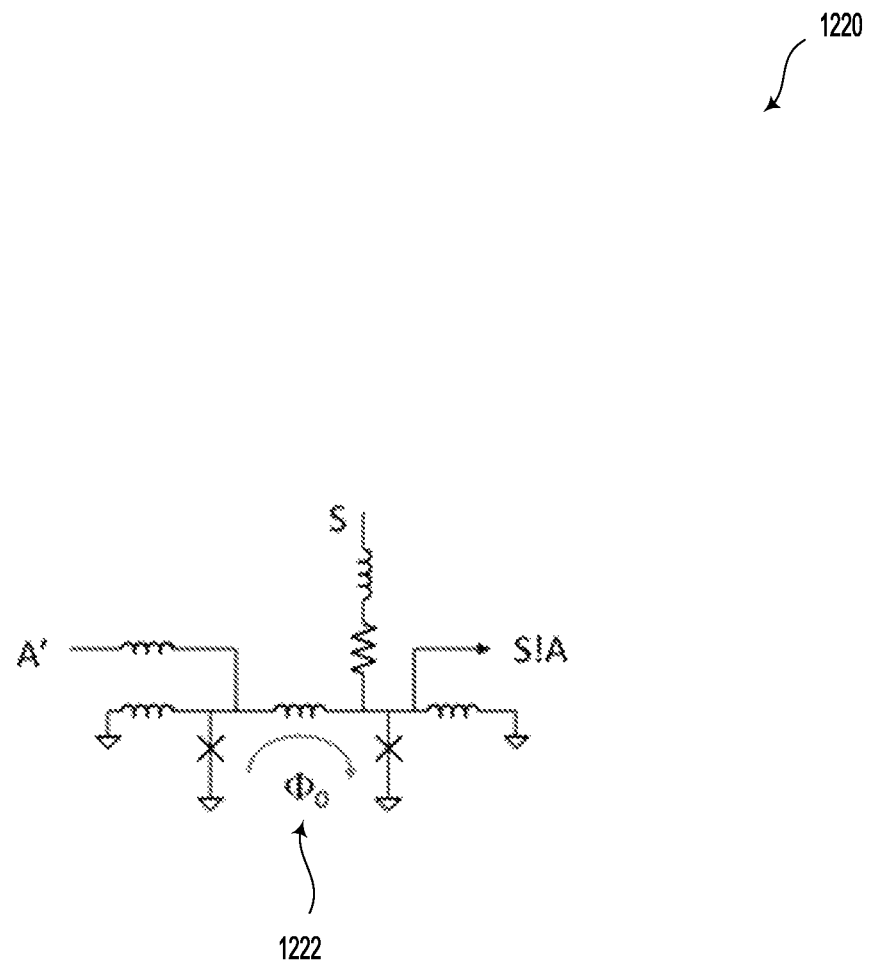
FIG. 12B illustrates a circuit diagram of a Josephson junction based circuit configured to provide a strobed logical inversion, in accordance with example embodiments.
Figure 12C:
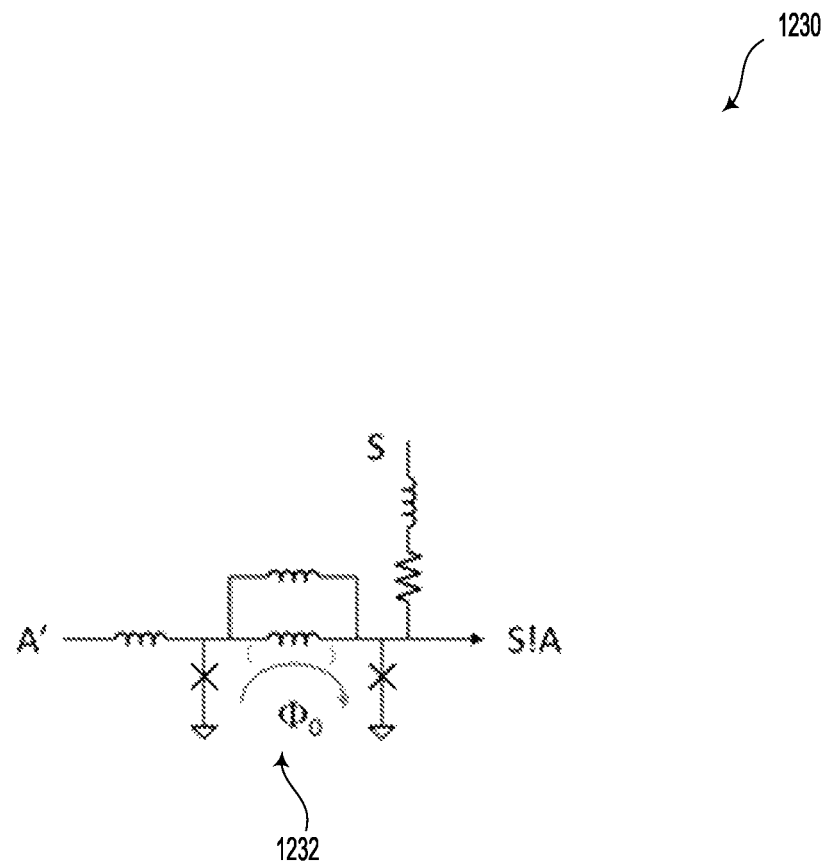
FIG. 12C illustrates a circuit diagram of a Josephson junction based circuit configured to provide a strobed logical inversion, in accordance with example embodiments.

FIGS. 12A, 12B, and 12C illustrate circuit variations configured to provide the logical inversion function. FIG. 12A illustrates a circuit diagram of a Josephson junction based circuit 1200 configured to provide a strobed logical inversion, in accordance with example embodiments. In such a scenario, a first loop 1202 could be initially biased with a flux bias equal to one full SFQ having a first polarity and a second loop 1204 could be initially biased with a flux bias equal to one full SFQ and also having the first polarity.

In an example embodiment, Josephson junction based circuit 1200 could include an input node 1206 inductively coupled to an input source 1208. In such scenarios, the input node 1206 could be inductively coupled to a common ground node by way of a first loop inductor 1210. The circuit 1200 could include an output node 1212 inductively coupled to the common ground node by way of a second loop inductor 1214. In some examples, the output node 1212 could be coupled to a strobe source 1216 by way of a strobe resistor 1219 and a strobe inductor 1218. The circuit 1200 includes a bridge inductor 1201 coupled between the input node 1206 and the output node 1212.

The circuit 1200 additionally includes a first Josephson junction 1203 coupled between the input node 1206 and the common ground node. The circuit 1200 also includes a second Josephson junction 1205 coupled between the output node 1212 and the common ground node. In such scenarios, the Josephson junction based circuit 1200 is configured to provide a strobed logical inversion function at the output node 1212 with respect to logical inputs provided by the input source 1208.

FIG. 12B illustrates a circuit diagram of a Josephson junction based circuit 1220 configured to provide a strobed logical inversion, in accordance with example embodiments. In such a scenario, a loop 1222 could be initially biased with a flux bias equal to one full SFQ and having a given polarity.

FIG. 12C illustrates a circuit diagram of a Josephson junction based circuit 1230 configured to provide a strobed logical inversion, in accordance with example embodiments. In such a scenario, a loop 1232 could be initially biased with a flux bias equal to one full SFQ and having a given polarity.

Figure 13:
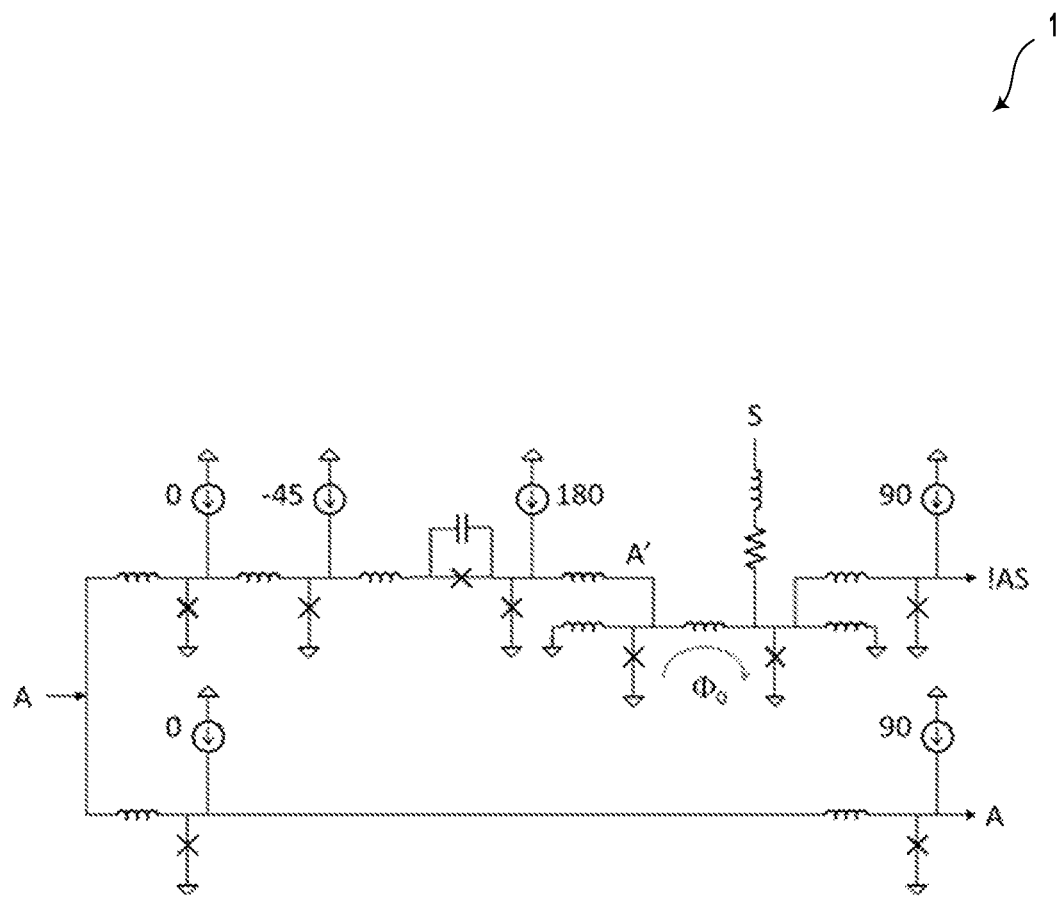
FIG. 13 illustrates a circuit diagram of a Josephson junction based circuit configured to convert a single-ended input into a strobed dual-rail signal, in accordance with example embodiments.

FIG. 13 illustrates a circuit diagram of a Josephson junction based circuit 1300 configured to convert a single-ended input into a strobed dual-rail signal, in accordance with example embodiments. The single-ended to dual-rail converter may accept return to zero (RZ) data encoding on the inputs, meaning that the inputs must transition low half a cycle after every transition high. This produces RZ encoding on the output.

Figure 14:
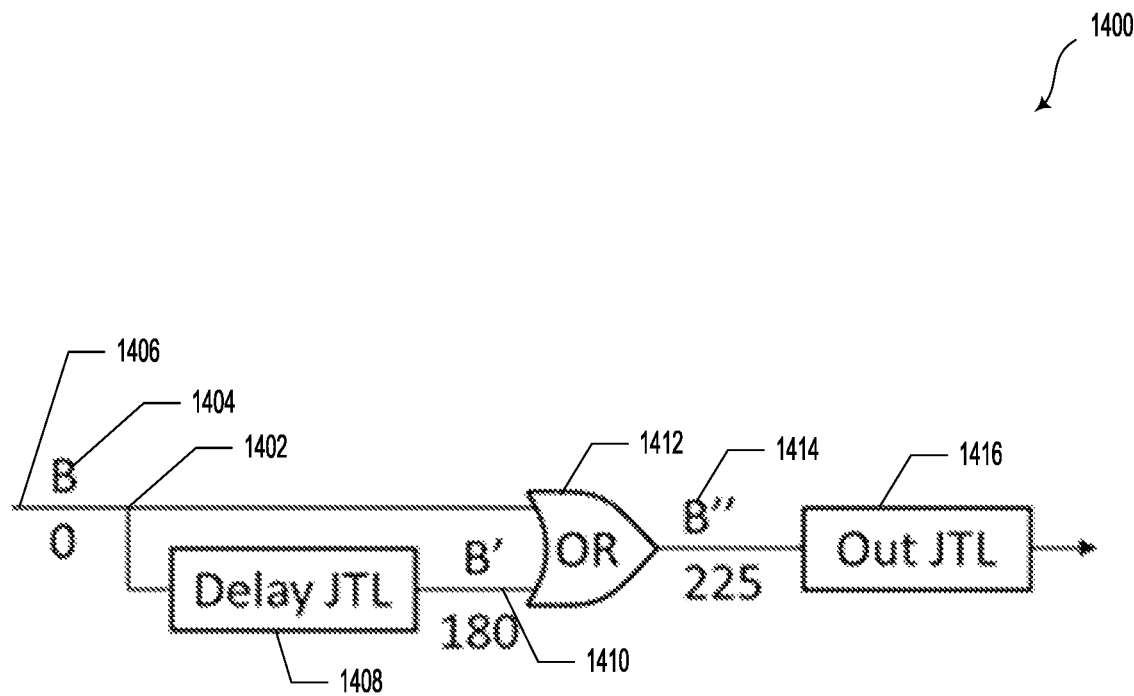
FIG. 14 illustrates a schematic logic diagram of a Josephson junction based circuit configured to remove dither from return-to-zero (RZ) data, in accordance with example embodiments.

A second auxiliary operation includes removing needless dither from the waveform, which improves power efficiency. FIG. 14 illustrates a schematic logic diagram of a Josephson junction based circuit 1400 configured to remove dither from RZ data, in accordance with example embodiments. In some examples, dither can be removed from the signal using an OR gate with non-standard phasing of the inputs and outputs. In some examples, the Josephson junction based circuit 1400 includes an input node 1402 configured to receive an input signal 1404 from an input source 1406. The circuit 1400 also includes a Josephson junction transmission line 1408 configured to accept the input signal 1404 from the input source 1406 and provide a delayed signal 1410. In such scenarios, the delayed signal 1410 is a version of the input signal 1404 that is delayed by 180°.

The circuit 1400 also includes an OR2 gate 1412 configured to accept the input signal 1404 and the delayed signal 1410 and provide an output signal 1414 that comprises a version of the input signal 1404 that is delayed by 225° and which does not include signal dithering.

Optionally, circuit 1400 could also include a Josephson junction transmission line 1416 coupled to the OR2 gate 1412 and configured to output the output signal 1414.

Figure 15:
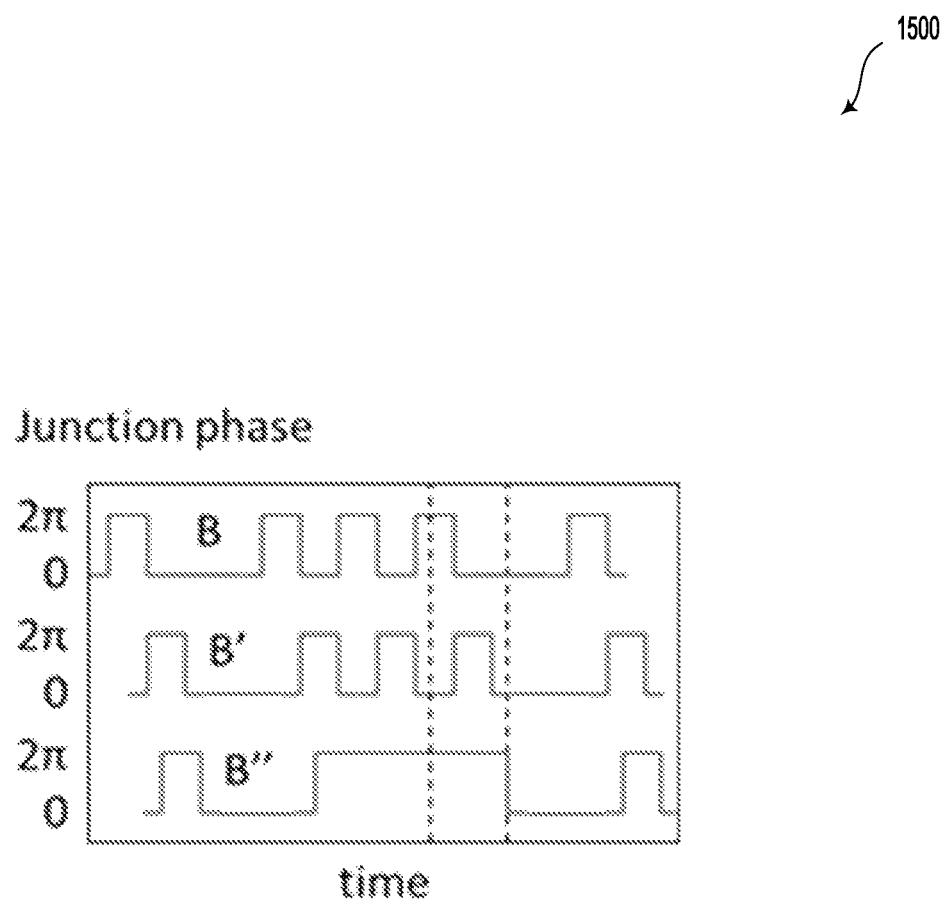
FIG. 15 illustrates a waveform diagram corresponding to an operation of the circuit of FIG. 14, in accordance with example embodiments.

FIG. 15 illustrates a waveform diagram 1500 corresponding to an operation of the circuit 1400 of FIG. 14, in accordance with example embodiments. Note that removing dither must entail half a clock cycle of latency simply based on causality. Otherwise, the desired behavior would require knowledge of signal transitions half a cycle in the future.

Example Methods

Figure 16:
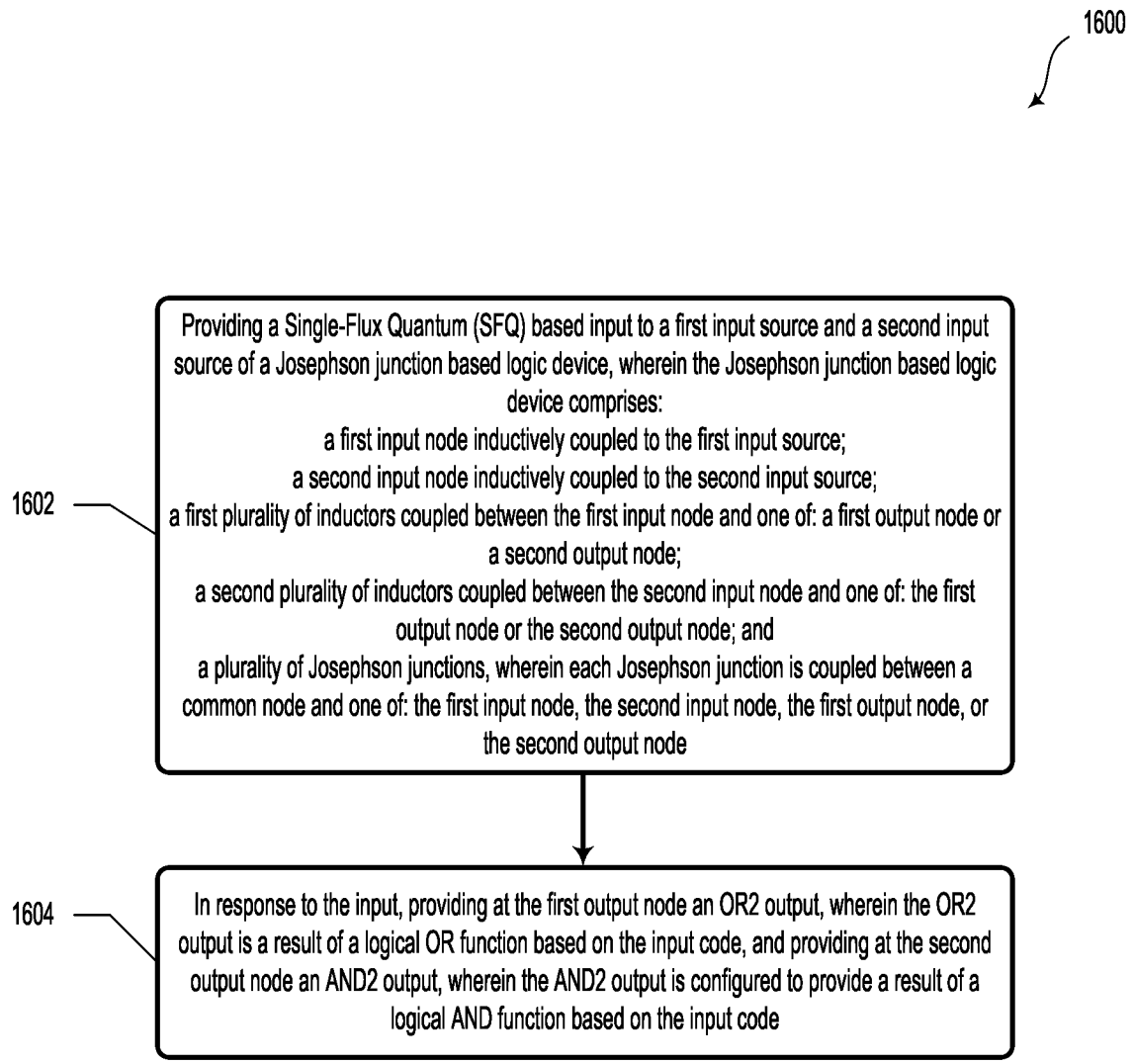
FIG. 16 illustrates a method, in accordance with example embodiments.

FIG. 16 illustrates a method 1600, in accordance with example embodiments. It will be understood that the method 1600 may include fewer or more steps or blocks than those expressly illustrated or otherwise disclosed herein. Furthermore, respective steps or blocks of method 1600 may be performed in any order and each step or block may be performed one or more times. In some embodiments, some or all of the blocks or steps of method 1600 may relate to OA2 gate 100 and/or OMA3 gate 500 as illustrated and described in relation to FIGS. 1 and 5.

Block 1602 includes providing a single-flux-quantum (SFQ) based input to a first input source (e.g., first input source 120) and a second input source (e.g., second input source 122) of a Josephson junction based logic device (e.g., OA2 gate 100). In such a scenario, the Josephson junction based logic device includes a first input node (e.g., first input node 110) inductively coupled to the first input source and a second input node (e.g., second input node 112) inductively coupled to the second input source. The logic device additionally includes a first plurality of inductors (e.g., first plurality of inductors 130) coupled between the first input node and one of: a first output node (e.g., first output node 140) or a second output node (e.g., second output node 142). The logic device also includes a second plurality of inductors (e.g., second plurality of inductors 132) coupled between the second input node and one of: the first output node or the second output node. The logic device includes a plurality of Josephson junctions (e.g., plurality of Josephson junctions 150). In such a scenario, each Josephson junction of the plurality of Josephson junctions could be coupled between a common node (e.g., ground) and one of: the first input node, the second input node, the first output node, or the second output node.

Block 1604 includes, in response to the input, providing at the first output node an OR2 output (e.g., OR2 output 160). In such a scenario, the OR2 output is a result of a logical OR function based on the input. Furthermore, in response to the input, Block 1604 includes providing at the second output node an AND2 output (e.g., AND2 output 162). In such scenarios, the AND2 output is configured to provide a result of a logical AND function based on the input.

In some example embodiments, method 1600 could include, while cooling down the Josephson junction based logic device, providing an initialization signal so as to create a desired flux bias in the first plurality of inductors. In such scenarios, method 1600 could also include, upon reaching a superconducting critical temperature of the Josephson junction based logic device, turning off the initialization signal such that the desired flux bias persists in the first plurality of inductors.

Figure 17:
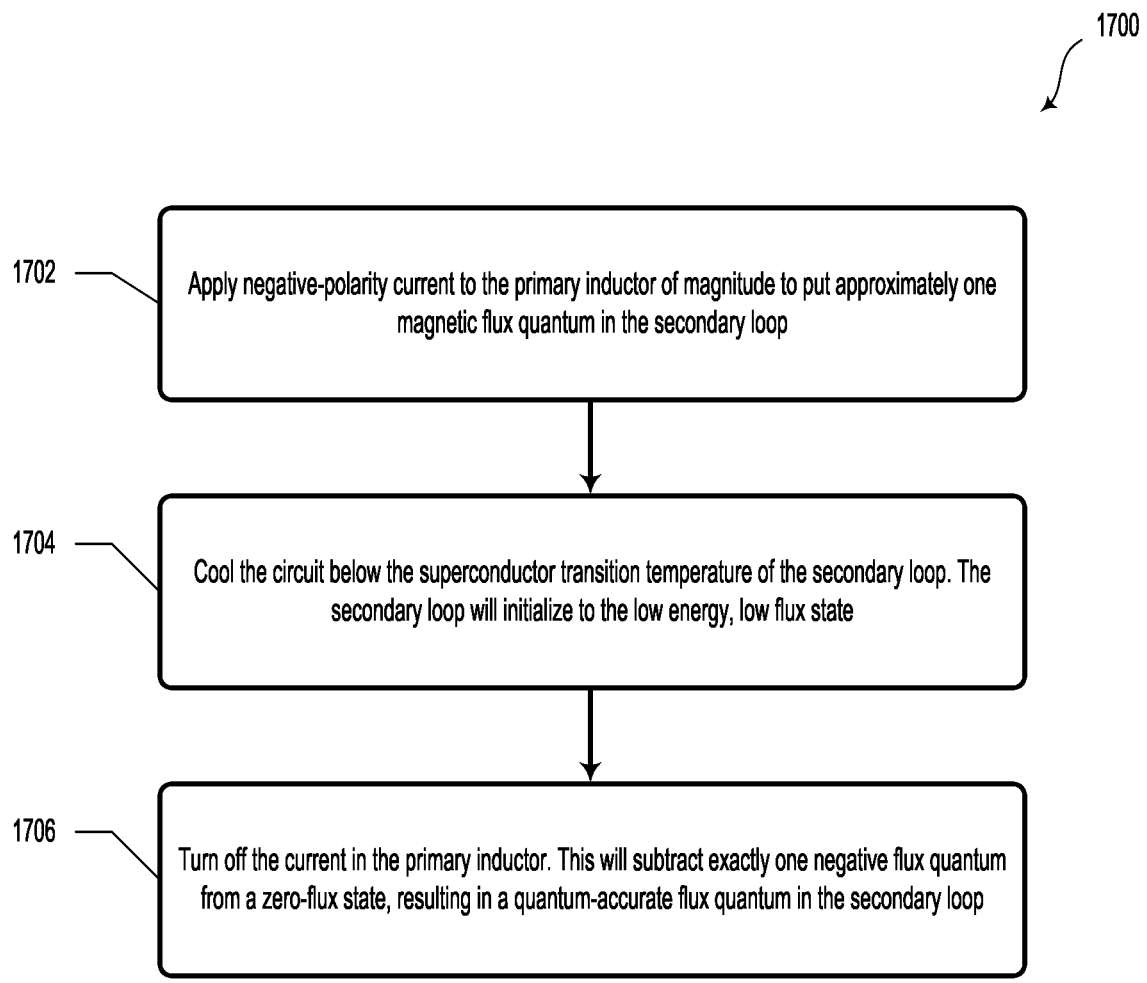
FIG. 17 illustrates a method, in accordance with example embodiments.

FIG. 17 illustrates a method 1700, in accordance with example embodiments. It will be understood that the method 1700 may include fewer or more steps or blocks than those expressly illustrated or otherwise disclosed herein. Furthermore, respective steps or blocks of method 1700 may be performed in any order and each step or block may be performed one or more times. In some embodiments, some or all of the blocks or steps of method 1700 may relate to OA2 gate 100 and/or OMA3 gate 500 as illustrated and described in relation to FIGS. 1 and 5.

Method 1700 relates to initializing a flux bias in one or more inductors of a plurality of inductors in a Josephson junction based logic device (e.g., OA2 gate 100 and/or OMA3 gate 500). In some embodiments, one or more primary inductors could be inductively coupled to one or more secondary loops, which are configured to store at least a portion of a magnetic flux quantum. In some embodiments, method 1700 could be carried out to initialize flux bias in one or several secondary loops in the given logic device.

As an example, method 1700 could be carried out, at least in part, by flux bias initialization system 170 and/or flux bias initialization system 570.

Block 1702 includes applying a negative polarity current to a primary inductor such that approximately one magnetic flux quantum is induced in a secondary loop.

Block 1704 includes cooling the circuit below the superconductor transition temperature of the secondary loop. The secondary loop will initialize to the low energy, low flux state.

Block 1706 includes turning off the current to the primary inductor to subtract exactly one negative flux quantum from the zero-flux state, thereby resulting in a quantum-accurate flux quantum in the secondary loop.

Upon initialization, the various logical functions and operations can be carried out by logic devices described herein.

Enumerated Example Embodiments

Embodiments of the present disclosure may thus relate to one of the enumerated example embodiments (EEEs) listed below.

EEE 1 includes a Josephson junction based logic device comprising:

a two-input OR/AND (OA2) gate, wherein the OA2 gate
comprises:
a first input node inductively coupled to a first input
source;
a second input node inductively coupled to a second input
source, wherein the first input source and the second
input source are configured to provide single-flux-
quantum (SFQ) pulses;
a first plurality of inductors coupled between the first
input node and one of: a first output node or a second
output node;
a second plurality of inductors coupled between the
second input node and one of: the first output node or
the second output node; and
a plurality of Josephson junctions, wherein each Joseph-
son junction is coupled between a common node and
one of: the first input node, the second input node, the
first output node, or the second output node.

EEE 2 includes the Josephson junction based logic device of EEE 1, wherein the first output node comprises an OR2 output, wherein the OR2 output is configured to provide a result of a logical OR function based on signals provided by the first input source and the second input source.

EEE 3 includes the Josephson junction based logic device of EEE 1, wherein the second output node comprises an AND2 output, wherein the AND2 output is configured to provide a result of a logical AND function based on signals provided by the first input source and the second input source.

EEE 4 includes the Josephson junction based logic device of EEE 1, wherein the Josephson junction based logic device is configured to produce one output pulse at the each output node in response to each input pulse provided at the input nodes.

EEE 5 includes the Josephson junction based logic device of EEE 1, wherein the first plurality of inductors are biased with a flux bias equal to one-half SFQ.

EEE 6 includes the Josephson junction based logic device of EEE 1, wherein the first plurality of inductors comprise:
a first pair of inductors coupled in parallel between the first input node and the first output node; and
a second pair of inductors coupled in parallel between the first input node and the second output node.

EEE 7 includes the Josephson junction based logic device of EEE 6, wherein at least a portion of the first plurality of inductors are biased with a flux bias equal to one full SFQ.

EEE 8 includes the Josephson junction based logic device of EEE 1, further comprising a global clock input configured to provide a global clock signal, wherein the Josephson junction based logic device is configured to operate based on the global clock signal.

EEE 9 includes the Josephson junction based logic device of EEE 8, wherein the global clock signal has a clock frequency of at least 30 GHz.

EEE 10 includes the Josephson junction based logic device of EEE 1, further comprising a plurality of OA2 gates coupled together in a logic block configured to accept two dual rail inputs and provide a plurality of logical outputs comprising: OR2, NOR2, AND2, NAND2, XOR2, and XNOR2.

EEE 11 includes a Josephson junction based logic device comprising:
a three-input OR/MAJ/AND (OMA3) gate, wherein the OMA3 gate comprises:
a first input node inductively coupled to a first input source;
a second input node inductively coupled to a second input source;
a third input node inductively coupled to a third input source, wherein the first input source, the second input source, and the third input source are configured to provide single-flux-quantum (SFQ) pulses;
a first plurality of inductors coupled between the first input node and one of: a first output node, a second output node, or a third output node;
a second plurality of inductors coupled between the second input node and one of: the first output node, the second output node, or the third output node;
a third plurality of inductors coupled between the third input node and one of: the first output node, the second output node, or the third output node; and
a plurality of Josephson junctions, wherein each Josephson junction is coupled between a common node and one of: the first input node, the second input node, the third input node, the first output node, the second output node, or the third output node.

EEE 12 includes the Josephson junction based logic device of EEE 11, wherein the first output node comprises an OR3 output, wherein the OR3 output is configured to provide a result of a logical OR function based on signals provided by the first input source, the second input source, and the third input source.

EEE 13 includes the Josephson junction based logic device of EEE 11, wherein the second output node comprises a MAJ3 output, wherein the MAJ3 output is configured to provide a result of a logical majority function based on signals provided by the first input source, the second input source, and the third input source.

EEE 14 includes the Josephson junction based logic device of EEE 11, wherein the third output node comprises an AND3 output, wherein the AND3 output is configured to provide a result of a logical AND function based on signals provided by the first input source, the second input source, and the third input source.

EEE 15 includes the Josephson junction based logic device of EEE 11, wherein the Josephson junction based logic device is configured to produce one output pulse at the each output node in response to each input pulse provided at the input nodes.

EEE 16 includes the Josephson junction based logic device of EEE 11, wherein at least a portion of the first plurality of inductors are biased with a flux bias equal to one full SFQ.

EEE 17 includes the Josephson junction based logic device of EEE 11, further comprising a global clock input configured to provide a global clock signal, wherein the Josephson junction based logic device is configured to operate based on the global clock signal, wherein the global clock signal has a clock frequency of at least 30 GHz.

EEE 18 includes the Josephson junction based logic device of EEE 11, further comprising a plurality of OMA3 gates coupled together in a logic block configured to accept three dual rail inputs and provide a plurality of logical outputs comprising: NOR3, XS3, NMAJ3, XD3, XNOR3, XNE3, NAND3, OR3, XNS3, MAJ3, XND3, XOR3, XE3, and AND3.

EEE 19 includes a method comprising:
providing a single-flux-quantum (SFQ) based input to a first input source and a second input source of a Josephson junction based logic device, wherein the Josephson junction based logic device comprises:
a first input node inductively coupled to the first input source;

a second input node inductively coupled to the second input source;
a first plurality of inductors coupled between the first input node and one of: a first output node or a second output node;
a second plurality of inductors coupled between the second input node and one of: the first output node or the second output node; and
a plurality of Josephson junctions, wherein each Josephson junction is coupled between a common node and one of: the first input node, the second input node, the first output node, or the second output node; and
in response to the input, providing at the first output node an OR2 output, wherein the OR2 output is a result of a logical OR function based on the input, and providing at the second output node an AND2 output, wherein the AND2 output is configured to provide a result of a logical AND function based on the input.

EEE 20 includes the method of EEE 19, further comprising:
while cooling down the Josephson junction based logic device, providing an initialization signal so as to create a desired flux bias in at least a portion of the first plurality of inductors; and
upon reaching a superconducting critical temperature of the Josephson junction based logic device, turning off the initialization signal such that the desired flux bias persists in the first plurality of inductors.

EEE 21 includes a method comprising:
providing a single-flux-quantum (SFQ) based input to a first input source, a second input
source, and a third input source of a Josephson junction based logic device, wherein the Josephson junction based logic device comprises:
a first input node inductively coupled to a first input source;
a second input node inductively coupled to a second input source;
a third input node inductively coupled to a third input source, wherein the first input source, the second input source, and the third input source are configured to provide single-flux-quantum (SFQ) pulses;
a first plurality of inductors coupled between the first input node and one of: a first output node, a second output node, or a third output node;
a second plurality of inductors coupled between the second input node and one of: the first output node, the second output node, or the third output node;
a third plurality of inductors coupled between the third input node and one of: the first output node, the second output node, or the third output node; and
a plurality of Josephson junctions, wherein each Josephson junction is coupled between a common node and one of: the first input node, the second input node, the third input node, the first output node, the second output node, or the third output node; and
in response to the input, providing at the first output node an OR3 output, wherein the OR3 output is a result of a logical OR function based on the input, providing at the second output node a MAJ3 output, wherein the MAJ3 output is configured to provide a result of a logical MAJ function based on the input, and providing at the third output node a AND3 output, wherein the AND3 output is configured to provide a result of a logical AND function based on the input.

EEE 22 includes the method of EEE 21, further comprising:
while cooling down the Josephson junction based logic device, providing an initialization signal so as to create a desired flux bias in at least a portion of the first plurality of inductors; and
upon reaching a superconducting critical temperature of the Josephson junction based logic device, turning off the initialization signal such that the desired flux bias persists in the first plurality of inductors.

EEE 23 includes an arrangement of Josephson junction based logical gates, wherein the arrangement comprises:
a plurality of Josephson junction based logical devices, wherein each logical device of the plurality of Josephson junction based logical devices comprises at least two inputs, is configured to accept single-flux-quantum (SFQ) input pulses, and is configured to provide, in response to each input pulse, a logical function output via at least two outputs.

EEE 24 includes the arrangement of logical gates of EEE 23, wherein the plurality of Josephson junction based logical devices comprises at least two two-input OR/AND (OA2) gates, wherein the OA2 gate comprises:
a first input node inductively coupled to a first input source;
a second input node inductively coupled to a second input source, wherein the first input source and the second input source are configured to provide single-flux-quantum (SFQ) pulses;
a first plurality of inductors coupled between the first input node and one of: a first output node or a second output node;
a second plurality of inductors coupled between the second input node and one of: the first output node or the second output node; and
a plurality of Josephson junctions, wherein each Josephson junction is coupled between a common node and one of: the first input node, the second input node, the first output node, or the second output node.

EEE 25 includes the arrangement of logical gates of EEE 23, wherein the plurality of Josephson junction based logical devices comprises at least two three-input OR/MAJ/AND (OMA3) gates, wherein the OMA3 gate comprises:
a first input node inductively coupled to a first input source;
a second input node inductively coupled to a second input source;
a third input node inductively coupled to a third input source, wherein the first input source, the second input source, and the third input source are configured to provide single-flux-quantum (SFQ) pulses;
a first plurality of inductors coupled between the first input node and one of: a first output node, a second output node, or a third output node;
a second plurality of inductors coupled between the second input node and one of: the first output node, the second output node, or the third output node;
a third plurality of inductors coupled between the third input node and one of: the first output node, the second output node, or the third output node; and
a plurality of Josephson junctions, wherein each Josephson junction is coupled between a common node and one of: the first input node, the second input node, the third input node, the first output node, the second output node, or the third output node.

EEE 26 includes the arrangement of logical gates of EEE 23, wherein the plurality of Josephson junction based logical devices comprises at least at least two two-input OR/AND (OA2) gates and two three-input OR/MAJ/AND (OMA3) gates, wherein the OA2 gate comprises:
- a first OA2 input node inductively coupled to a first OA2 input source;
- a second OA2 input node inductively coupled to a second OA2 input source, wherein the first OA2 input source and the second OA2 input source are configured to provide single-flux-quantum (SFQ) pulses;
- a first plurality of OA2 inductors coupled between the first OA2 input node and one of: a first OA2 output node or a second OA2 output node;
- a second plurality of OA2 inductors coupled between the second OA2 input node and one of: the first OA2 output node or the second OA2 output node; and
- a plurality of OA2 Josephson junctions, wherein each Josephson junction is coupled between a common node and one of: the first OA2 input node, the second OA2 input node, the first OA2 output node, or the second OA2 output node, and wherein the OMA3 gate comprises:
- a first OMA3 input node inductively coupled to a first OMA3 input source;
- a second OMA3 input node inductively coupled to a second OMA3 input source;
- a third OMA3 input node inductively coupled to a third OMA3 input source, wherein the first OMA3 input source, the second OMA3 input source, and the third OMA3 input source are configured to provide single-flux-quantum (SFQ) pulses;
- a first plurality of OMA3 inductors coupled between the first OMA3 input node and one of: a first OMA3 output node, a second OMA3 output node, or a third OMA3 output node;
- a second plurality of OMA3 inductors coupled between the second OMA3 input node and one of: the first OMA3 output node, the OMA3 second output node, or the OMA3 third output node;
- a third plurality of OMA3 inductors coupled between the third OMA3 input node and one of: the first OMA3 output node, the second OMA3 output node, or the third OMA3 output node; and
- a plurality of OMA3 Josephson junctions, wherein each OMA3 Josephson junction is coupled between a common node and one of: the first OMA3 input node, the second OMA3 input node, the third OMA3 input node, the first OMA3 output node, the OMA3 second output node, or the third OMA3 output node.

EEE 27 includes the arrangement of logical gates of EEE 23, wherein the logical function output comprises at least one of: OR2, NOR2, AND2, NAND2, XOR2, XNOR2, NOR3, XS3, NMAJ3, XD3, XNOR3, XNE3, NAND3, OR3, XNS3, MAJ3, XND3, XOR3, XE3, or AND3.

EEE 28 includes a Josephson junction based logical device, comprising:
- an input node inductively coupled to an input source, wherein the input node is inductively coupled to a common ground node by way of a first loop inductor;
- an output node inductively coupled to the common ground node by way of a second loop inductor, wherein the output node is coupled to a strobe source by way of a strobe resistor and a strobe inductor;
- a bridge inductor coupled between the input node and the output node;
- a first Josephson junction coupled between the input node and the common ground node; and
- a second Josephson junction coupled between the output node and the common ground node, wherein the Josephson junction based logical device is configured to provide a strobed logical inversion function at the output node with respect to logical inputs provided by the input source.

EEE 29 includes a strobed, single-ended to dual-rail converter based on the Josephson junction based logical device of EEE 28, wherein the single-ended to dual-rail converter is configured to accept a return-to-zero (RZ) input signal, wherein the single-ended to dual-rail converter is configured to output the RZ input signal as well as a strobed complement of the RZ input signal.

EEE 30 includes a Josephson junction based logical device, comprising:
- an input node configured to receive an input signal from an input source;
- a Josephson junction transmission line configured to accept the input signal from the input source and provide a delayed signal, wherein the delayed signal comprises a version of the input signal that is delayed by 180°;
- an OR2 gate configured to accept the input signal and the delayed signal and provide an output signal that comprises a version of the input signal without signal dithering; and
- an optional Josephson junction transmission line coupled to the OR2 gate and configured to output the output signal.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A Josephson junction based logic device comprising:
   a two-input OR/AND (OA2) gate, wherein the OA2 gate consists of:
   a first input node inductively coupled to a first input source;
   a second input node inductively coupled to a second input source, wherein the first input source and the second input source are configured to provide single-flux-quantum (SFQ) pulses;
   a first plurality of inductors coupled between the first input node and one of: a first output node or a second output node;
   a second plurality of inductors coupled between the second input node and one of: the first output node or the second output node; and
   a plurality of Josephson junctions, wherein each Josephson junction is coupled between a common node and one of: the first input node, the second input node, the first output node, or the second output node.

2. The Josephson junction based logic device of claim 1, wherein the first output node comprises an OR2 output, wherein the OR2 output is configured to provide a result of a logical OR function based on signals provided by the first input source and the second input source, wherein the second output node comprises an AND2 output, wherein the AND2 output is configured to provide a result of a logical AND function based on signals provided by the first input source and the second input source.

3. The Josephson junction based logic device of claim 1, wherein the Josephson junction based logic device is configured to produce one output pulse at each output node in response to each input pulse provided at the input nodes.

4. The Josephson junction based logic device of claim 1, wherein the first plurality of inductors are biased with a flux bias equal to one-half SFQ.

5. The Josephson junction based logic device of claim 1, wherein the first plurality of inductors comprise:
a first pair of inductors coupled in parallel between the first input node and the first output node; and
a second pair of inductors coupled in parallel between the first input node and the second output node.

6. The Josephson junction based logic device of claim 5, wherein at least a portion of the first plurality of inductors are biased with a flux bias equal to one full SFQ.

7. The Josephson junction based logic device of claim 1, further comprising a global clock input configured to provide a global clock signal, wherein the Josephson junction based logic device is configured to operate based on the global clock signal.

8. The Josephson junction based logic device of claim 7, wherein the global clock signal has a clock frequency of at least 30 GHz.

9. The Josephson junction based logic device of claim 1, further comprising a plurality of OA2 gates coupled together in a logic block configured to accept two dual rail inputs and provide a plurality of logical outputs comprising: OR2, NOR2, AND2, NAND2, XOR2, and XNOR2.

10. A method comprising:
providing a single-flux-quantum (SFQ) based input to a Josephson junction based logic device, wherein the Josephson junction based logic device comprises at least one of: an OA2 gate, wherein the OA2 gate consists of:
a first OA2 input node inductively coupled to a first OA2 input source;
a second OA2 input node inductively coupled to a second OA2 input source;
a first plurality of OA2 inductors coupled between the first OA2 input node and one of: a first OA2 output node or a second OA2 output node;
a second plurality of OA2 inductors coupled between the second OA2 input node and one of: the first OA2 output node or the second OA2 output node; and
a plurality of OA2 Josephson junctions, wherein each OA2 Josephson junction is coupled between a common node and one of: the first OA2 input node, the second OA2 input node, the first OA2 output node, or the second OA2 output node; and
in response to the input, providing at an output node a logical function based on the input, wherein the logical function comprises at least one of: OR2, NOR2, AND2, NAND2, XOR2, and XNOR2.

11. The method of claim 10, further comprising:
while cooling down the Josephson junction based logic device, providing an initialization signal so as to create a desired flux bias in at least a portion of the first plurality of OA2 inductors; and
upon reaching a superconducting critical temperature of the Josephson junction based logic device, turning off the initialization signal such that the desired flux bias persists in the first plurality of OA2 inductors.

12. The method of claim 10, further comprising converting a single-ended encoded signal to a dual rail encoded signal, wherein the converting is performed by way of a SFQ based strobed logical inversion circuit, wherein the logical inversion circuit comprises a polarity inversion portion and a logical inversion portion.

13. The method of claim 12, wherein the SFQ based input comprises the dual rail encoded signal.

14. The method of claim 12, further comprising removing dither from at least a portion of the dual rail data signal, wherein the removing is performed by way of a Josephson junction based circuit, wherein the Josephson junction based circuit comprises at least one Josephson junction transmission line, at least one delay element, and at least one OR2 gate.

* * * * *